United States Patent
Chihlas et al.

(10) Patent No.: US 9,166,087 B2
(45) Date of Patent: Oct. 20, 2015

(54) WIND UPLIFT-RESISTANT PHOTOVOLTAIC ROOFING ELEMENTS AND PHOTOVOLTAIC ROOFING SYSTEMS

(71) Applicant: CertainTeed Corporation, Valley Forge, PA (US)

(72) Inventors: Peter Chihlas, Lansdale, PA (US); Robert Jenkins, Honeybrook, PA (US); Robert Livsey, Limerick, PA (US); Chris Fisher, Philadelphia, PA (US); Alex Nash, Ridley Park, PA (US)

(73) Assignee: CertainTeed Corporation, Valley Forge, PA (US)

( * ) Notice: Subject to any disclaimer, the term of this patent is extended or adjusted under 35 U.S.C. 154(b) by 0 days.

(21) Appl. No.: 14/043,621

(22) Filed: Oct. 1, 2013

(65) Prior Publication Data

US 2014/0102518 A1    Apr. 17, 2014

Related U.S. Application Data

(63) Continuation-in-part of application No. 13/326,081, filed on Dec. 14, 2011, now Pat. No. 8,601,754.

(60) Provisional application No. 61/429,053, filed on Dec. 31, 2010, provisional application No. 61/528,631, filed on Aug. 29, 2011, provisional application No. 61/559,614, filed on Nov. 14, 2011.

(51) Int. Cl.
*F24J 2/52* (2006.01)
*H02S 30/10* (2014.01)
(Continued)

(52) U.S. Cl.
CPC ........... *H01L 31/0482* (2013.01); *F24J 2/5254* (2013.01); *H02S 20/23* (2014.12); *H02S 20/25* (2014.12); *F24J 2/5211* (2013.01); *F24J 2002/0061* (2013.01); *F24J 2002/467* (2013.01); *F24J 2002/4661* (2013.01); *Y02B 10/12* (2013.01)

(58) Field of Classification Search
CPC ........ Y02B 10/12; Y02B 10/20; Y02B 10/50; Y02B 10/47; F24J 2/5211; F24J 2/5262; F24J 2/5207; H01L 31/02008
USPC .................. 52/173.3, 302.1, 302.3, 302.4, 60
See application file for complete search history.

(56) References Cited

U.S. PATENT DOCUMENTS 3,579,940 A    5/1971    Greenleaf
5,457,057 A    10/1995    Nath et al.
(Continued)

FOREIGN PATENT DOCUMENTS

WO    2006/043658    4/2006

*Primary Examiner* — Elizabeth A Plummer
*Assistant Examiner* — Kyle Walraed-Sullivan
(74) *Attorney, Agent, or Firm* — McDonnell Boehnen Hulbert & Berghoff LLP

(57) ABSTRACT

The present invention relates generally to the photovoltaic generation of electrical energy. The present invention relates more particularly to photovoltaic arrays for use in photovoltaically generating electrical energy. Aspects of the present invention provide a variety of photovoltaic roofing elements and systems that include, for example, interlocking geometries to provide for water handling and integration with conventional roofing materials; wire management features that can protect wiring and associated electrical components from physical and/or environmental damage; and wind clip and ledge features configured to prevent against wind uplift of the photovoltaic roofing elements when installed.

20 Claims, 29 Drawing Sheets

(51) Int. Cl.
*H01L 31/048* (2014.01)
*H02S 20/23* (2014.01)
*H02S 20/25* (2014.01)
*F24J 2/00* (2014.01)
*F24J 2/46* (2006.01)

(56) References Cited

U.S. PATENT DOCUMENTS

| | | |
|---|---|---|
| 5,968,287 A | 10/1999 | Nath |
| 7,012,188 B2 * | 3/2006 | Erling ........................ 136/251 |
| 7,138,578 B2 | 11/2006 | Komamine |
| 7,506,477 B2 * | 3/2009 | Flaherty et al. ............. 52/173.3 |
| 8,141,306 B2 | 3/2012 | Masuda et al. |
| 2006/0196128 A1 * | 9/2006 | Duke ........................... 52/173.3 |
| 2008/0289272 A1 * | 11/2008 | Flaherty et al. ............. 52/173.3 |
| 2008/0302030 A1 * | 12/2008 | Stancel et al. .............. 52/173.3 |
| 2008/0313976 A1 * | 12/2008 | Allen ........................... 52/173.1 |
| 2010/0065108 A1 * | 3/2010 | West et al. ................... 136/251 |
| 2010/0313501 A1 * | 12/2010 | Gangemi ..................... 52/173.3 |
| 2011/0083381 A1 * | 4/2011 | David et al. ................. 52/173.3 |
| 2011/0094560 A1 * | 4/2011 | Keenihan et al. ........... 136/244 |
| 2012/0186630 A1 | 7/2012 | Jenkins et al. |
| 2012/0210660 A1 | 8/2012 | Livsey et al. |
| 2012/0240490 A1 | 9/2012 | Gangemi |

* cited by examiner

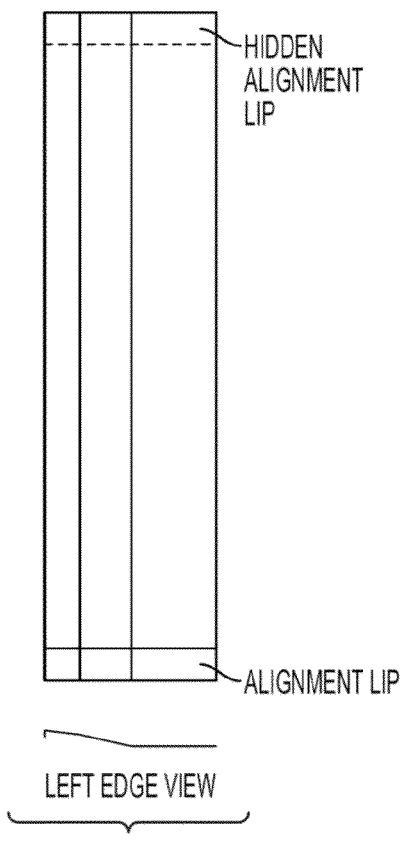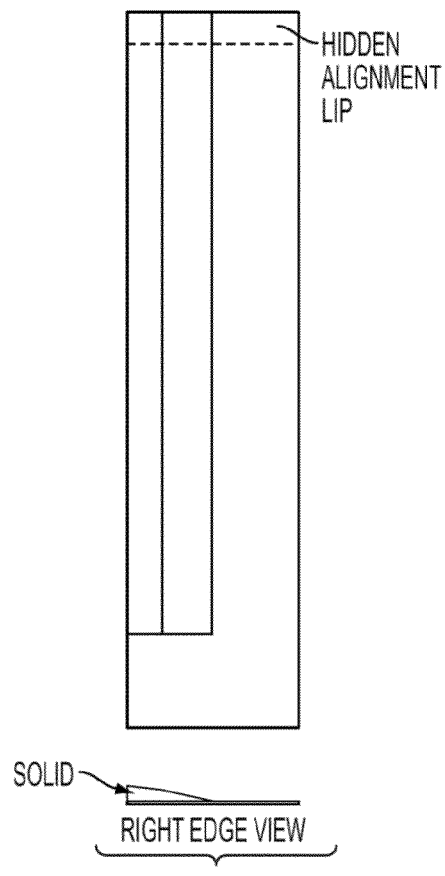
FIG. 33
FIG. 34

3620
3610 3615
TOP VIEW

BACK VIEW

FRONT VIEW

SIDE VIEW

WIND UPLIFT-RESISTANT PHOTOVOLTAIC ROOFING ELEMENTS AND PHOTOVOLTAIC ROOFING SYSTEMS

CROSS-REFERENCE TO RELATED APPLICATIONS

This application is a continuation-in-part of U.S. patent application Ser. No. 13/326,081, which claims the benefit of priority of U.S. Provisional Patent Application Ser. Nos. 61/429,053, 61/528,631, and 61/559,614, each of which is hereby incorporated herein by reference in its entirety.

BACKGROUND OF THE INVENTION

1. Field of the Invention

The present invention relates generally to the photovoltaic generation of electrical energy. The present invention relates more particularly to photovoltaic roofing products for use in photovoltaically generating electrical energy.

2. Technical Background

The search for alternative sources of energy has been motivated by at least two factors. First, fossil fuels have become increasingly expensive due to increasing scarcity and unrest in areas rich in petroleum deposits. Second, there exists overwhelming concern about the effects of the combustion of fossil fuels on the environment due to factors such as air pollution (from $NO_x$, hydrocarbons and ozone) and global warming (from $CO_2$). In recent years, research and development attention has focused on harvesting energy from natural environmental sources such as wind, flowing water, and the sun. Of the three, the sun appears to be the most widely useful energy source across the continental United States; most locales get enough sunshine to make solar energy feasible.

Accordingly, there are now available components that convert light energy into electrical energy. Such "photovoltaic cells" are often made from semiconductor-type materials such as doped silicon in either single crystalline, polycrystalline, or amorphous form. The use of photovoltaic cells on roofs is becoming increasingly common, especially as system performance has improved. They can be used, for example, to provide at least a significant fraction of the electrical energy needed for a building's overall function; or they can be used to power one or more particular devices, such as exterior lighting systems and well pumps.

Accordingly, research and development attention has turned toward the development of photovoltaic products that are adapted to be installed on a roof. While stand-alone photovoltaic modules have been in use for some time, they tend to be heavy and bulky, and aesthetically unfavorable when installed on a roof. Roofing products having photovoltaic cells integrated with roofing products such as shingles, shakes or tiles, or roofing panels have been proposed. Examples of such proposals have been disclosed in U.S. Patent Application Publication nos. 2006/0042683, 2008/0149163, 2010/0313499 and 2010/0313501, and in U.S. Pat. No. 4,040,867, each of which is hereby incorporated by reference herein in its entirety. A plurality of such photovoltaic roofing elements (i.e., including photovoltaic media integrated with a roofing product) can be installed together on a roof, and electrically interconnected to form a photovoltaic roofing system that provides both environmental protection and photovoltaic power generation. These can be very advantageous, but can be difficult to install on steep surfaces, while ensuring sufficient closure of the roof against the elements, particularly wind driven rain, and can often result in incomplete coverage of the roof surface with photovoltaic power generation. Moreover, as it is often desirable to have photovoltaic roofing elements covering a portion of a roof surface and conventional roofing products covering the remainder of the surface, there is a need for systems that provide aesthetic effect in the transition zone between the conventional roofing products (e.g., roofing tiles and asphalt shingles) and the photovoltaic roofing elements while closing the roof and the array of photovoltaic roofing elements to the environment.

Individual photovoltaic roofing elements within a larger photovoltaic roofing system are often electrically interconnected using wiring such as wires or cables. Similarly, wiring is often used to connect the array to an electrical system. But in many systems, the wiring is at risk of being dislocated, being damaged, or being pinched or bent into a radius tighter than allowed by code during handling and installation. This risk is especially high when the photovoltaic roofing element includes support structures such as downward-facing ribs, as the installer may not be able to determine if wiring is pinched between the support structure and the underlying roof deck. Damaged wire can cause power loss over time, injury, or fire, and is therefore undesirable.

A variety of designs have been proposed for photovoltaic roofing elements. For example, U.S. Patent Application Publications nos. 2012/0210660, 2012/0186630 and 2013/0125482, each of which is hereby incorporated herein by reference in its entirety, disclose photovoltaic roofing elements in which photovoltaic media is disposed in a frame structure having integrated water management features. However, such photovoltaic roofing elements are often rigid, and thus can be especially susceptible to wind uplift.

There remains a need for photovoltaic products that address one or more of these deficiencies.

SUMMARY OF THE INVENTION

One aspect of the invention is a photovoltaic roofing element comprising:
a frame structure having a top end and a bottom end, and an upward-facing surface and a downward-facing surface, the frame structure having an attachment zone and an exposure zone, with the exposure zone disposed toward the bottom end of the frame structure, and the attachment zone disposed toward the top end of the frame structure, the frame structure further including a ledge extending away from the top end of the frame structure and one or more wind clips extending from the downward-facing surface of the frame structure in the exposure zone, the ledge and the one or more wind clips being configured such that, when installed in a photovoltaic roofing system, the wind clip of an overlying photovoltaic roofing element engages the ledge of an underlying photovoltaic roofing element; and
one or more photovoltaic elements held in the exposure zone of the frame structure.

Another aspect of the invention is a photovoltaic roofing system comprising a first course of horizontally-arranged photovoltaic roofing elements and a second course of horizontally-arranged photovoltaic roofing elements overlying the first course, each photovoltaic roofing element comprising:
a frame structure having a top end and a bottom end, and an upward-facing surface and a downward-facing surface, the frame structure having an attachment zone and an exposure zone, with the exposure zone disposed toward the bottom end of the frame structure, and the attachment zone disposed toward the top end of the frame structure, the frame structure further including a ledge extending away from the top end of the frame structure and one or more wind clips extending from the downward-facing surface of the frame structure in the exposure zone; and one or more photovoltaic elements held in the exposure zone of the frame structure, wherein the second course overlies the first course such that the exposure zones of the photovoltaic roofing elements of the first course are substantially exposed and the attachment zones of the photovoltaic roofing elements of the first course are substantially overlaid, and the one or more wind clips of each photovoltaic roofing elements of the second course engage the ledge of one or more of the photovoltaic roofing elements of the first course.

Another aspect of the invention is a photovoltaic roofing element comprising:

a frame structure having a top end and a bottom end, and an upward-facing surface and a downward-facing surface, the frame structure having an attachment zone and an exposure zone, with the exposure zone disposed toward the bottom end of the frame structure, and the attachment zone disposed toward the top end of the frame structure, the frame structure further comprising an L-shaped ridge extending laterally on its upward-facing surface in the attachment zone, the L-shaped ridge comprising a feature extending substantially vertically from the upward-facing surface and a feature extending from the upward end of the vertically-extending feature substantially horizontally toward the bottom end of the frame structure, the frame structure further comprising one or more wind clips formed on the underside of the frame structure at its bottom end, each wind clip comprising a feature extending substantially horizontally toward the top end of the frame structure, the L-shaped ridge and the one or more wind clips being configured such that, when installed in a photovoltaic roofing system, the horizontal feature of each wind clip of the overlying photovoltaic roofing element is disposed under the horizontally-extending feature of the L-shaped ridge of an underlying photovoltaic roofing element; and one or more photovoltaic elements held in the exposure zone of the frame structure.

Another aspect of the invention is a photovoltaic roofing system comprising a first course of horizontally-arranged photovoltaic roofing elements and a second course of horizontally-arranged photovoltaic roofing elements overlying the first course, each photovoltaic roofing element comprising:

a frame structure having a top end and a bottom end, and an upward-facing surface and a downward-facing surface, the frame structure having an attachment zone and an exposure zone, with the exposure zone disposed toward the bottom end of the frame structure, and the attachment zone disposed toward the top end of the frame structure, the frame structure further comprising an L-shaped ridge extending laterally on its upward-facing surface in the attachment zone, the L-shaped ridge comprising a feature extending substantially vertically from the upward-facing surface and a feature extending from the upward end of the vertically-extending feature substantially horizontally toward the bottom end of the frame structure, the frame structure further comprising one or more wind clips formed on the underside of the frame structure at its bottom end, each wind clip comprising a feature extending substantially horizontally toward the top end of the frame structure; and one or more photovoltaic elements held in the exposure zone of the frame structure, wherein the second course overlies the first course such that the exposure zones of the photovoltaic roofing elements of the first course are substantially exposed and the attachment zones of the photovoltaic roofing elements of the first course are substantially overlaid, and the one or more wind clips of each photovoltaic roofing elements of the second course engage the L-shaped ridge ledge of one or more of the photovoltaic roofing elements of the first course, such that the horizontal feature of each wind clip of the a photovoltaic roofing element of the second course is disposed under the horizontally-extending feature of the L-shaped ridge of a photovoltaic roofing element of the first course.

Another aspect of the invention is a photovoltaic roofing system disposed on a roof deck having an top end and a bottom end, the photovoltaic roofing system comprising: one or more photovoltaic roofing elements as described herein (e.g., arrayed as described herein); a plurality of roofing elements disposed adjacent the contiguously-disposed photovoltaic roofing elements, along their side edges; and side flashing elements disposed along the side edges of the contiguously-disposed photovoltaic roofing elements, the side flashing elements having a cross-sectional shape comprising a vertically-extending feature and a flange extending away from a lateral side at the downward end of the vertically-extending feature, with the flange facing away from the contiguously-disposed photovoltaic roofing elements and being at least partially disposed between a roofing element and the roof deck, the vertically-extending feature including a matched interlocking geometry adapted to interlock with the sidelap portion of an adjacent photovoltaic roofing element.

Another aspect of the invention is a photovoltaic roofing system disposed on a roof deck having an top end and a bottom end, the photovoltaic roofing system comprising: one or more photovoltaic roofing elements as described herein (e.g., arrayed as described herein); a plurality of roofing elements disposed adjacent the contiguously-disposed photovoltaic roofing elements, along their side edges; each roofing element having an edge facing the photovoltaic roofing elements, the edge including a matched interlocking geometry interlocking with the sidelap portion of an adjacent photovoltaic roofing element.

Another aspect of the invention is a photovoltaic roofing system comprising a first course of horizontally-arranged photovoltaic roofing elements, each photovoltaic roofing element comprising:

a frame structure having a top end and a bottom end, and an upward-facing surface and a downward-facing surface, the frame structure having an attachment zone and an exposure zone, with the exposure zone disposed toward the bottom end of the frame structure, and the attachment zone disposed toward the top end of the frame structure, the frame structure further comprising an L-shaped ridge extending laterally on its upward-facing surface in the attachment zone, the L-shaped ridge comprising a feature extending substantially vertically from the upward-facing surface and a feature extending from the upward end of the vertically-extending feature substantially horizontally toward the bottom end of the frame structure, the frame structure further comprising one or more wind clips formed on the underside of the frame structure at its bottom end, each wind clip comprising a feature extending substantially horizontally toward the top end of the frame structure; or a frame structure having a top end and a bottom end, and an upward-facing surface and a downward-facing surface, the frame structure having an attachment zone and an exposure zone, with the exposure zone disposed toward the bottom end of the frame structure, and the attachment zone disposed toward the top end of the frame structure, the frame structure further including a ledge extending away from the top end of the frame structure and one or more wind clips extending from the downward-facing surface of the frame structure in the exposure zone, the photovoltaic roofing system further comprising a cant strip or a starter strip disposed under the attachment zones of the photovoltaic elements of the first course, the cant strip or the starter strip having a feature that engages the wind clips of the photovoltaic roofing elements. In certain embodiments, the cant strip or the starter strip includes a horizontally-extending feature that is disposed above a horizontally-extending feature of the wind clips (i.e., to mimic the performance of the ledge or the L-shaped ridge). Such a horizontally-extending feature can be shaped like the horizontally-extending feature of the ledge or the L-shaped ridge as described above.

Another aspect of the invention is a method for installing a photovoltaic roofing system on a roof deck having a top end and a bottom end, the roof deck having disposed thereon a plurality of roofing elements method including contiguously disposing one or more photovoltaic roofing elements on the roof deck, each photovoltaic roofing element comprising a frame structure having an upward-facing surface and a downward-facing surface having a top end and a bottom end, the frame structure having an attachment zone and an exposure zone, with the exposure zone disposed toward the bottom end of the frame structure, and the attachment zone disposed toward the top end of the frame structure; and one or more photovoltaic elements held in the exposure zone of the frame structure, the contiguously-disposed photovoltaic elements together having a top edge facing the top end of the roof deck, a bottom edge facing the bottom end of the roof deck, and two side edges wherein the roofing elements are disposed along the side edges, the sidelap portions of the photovoltaic roofing elements interlocking to provide water drainage channels; and disposing side flashing elements disposed along the side edges of the contiguously-disposed photovoltaic roofing elements, the side flashing elements having a cross-sectional shape comprising a vertically-extending feature and a flange extending away from a lateral side at the downward end of the vertically-extending feature, with the flange facing away from the contiguously-disposed photovoltaic roofing elements and being at least partially disposed between a roofing element and the roof deck, the vertically-extending feature including a matched interlocking geometry adapted to interlock with the sidelap portion of an adjacent photovoltaic roofing element.

The invention will be further described with reference to embodiments depicted in the appended figures. It will be appreciated that elements in the figures are illustrated for simplicity and clarity and have not necessarily been drawn to scale. For example, the dimensions of some of the elements in the figures may be exaggerated relative to other elements to help to improve understanding of embodiments of the invention.

BRIEF DESCRIPTION OF THE DRAWINGS

The accompanying drawings are not necessarily to scale, and sizes of various elements can be distorted for clarity.

FIGS. 33-35 are schematic top and edge views of top flashing pieces suitable for use in certain embodiments of the invention;

DETAILED DESCRIPTION OF THE INVENTION

Figure 1:
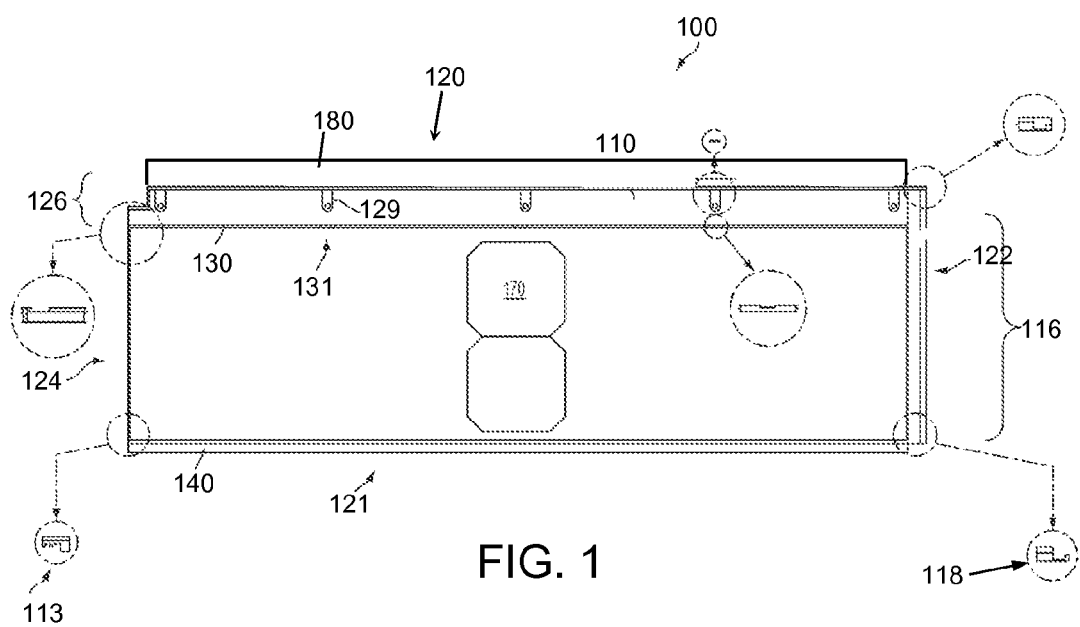
FIG. 1 presents a top schematic view and various partial cross-sectional views of a photovoltaic roofing element according to one embodiment of the invention.

One aspect of the invention relates to a photovoltaic roofing element, configured to be disposed on a roof deck having a top end (i.e., toward the ridge of the roof) and a bottom end (i.e., toward the eave of the roof). The photovoltaic roofing element includes a frame structure having an upward-facing surface and a downward-facing surface. The frame structure includes an attachment zone and an exposure zone, with the exposure zone disposed toward the bottom end of the frame structure, and the attachment zone disposed toward the top end of the frame structure. The photovoltaic roofing element further includes one or more photovoltaic elements held in the frame structure.

In certain embodiments, the frame structure includes sidelap portions disposed at its lateral edges and having geometries adapted to interlock with adjacent photovoltaic roofing elements to provide water drainage channels. For example, in one embodiment, the sidelap portion at one lateral edge has an upward-facing water drainage channel; and the sidelap portion at the other lateral edge has a downward-facing flange that fits into the water drainage channel of an adjacent (e.g., identical) photovoltaic roofing element. This configuration is preferred, as it allows a single type of photovoltaic roofing element to be used in an installation. Of course in other embodiments, a single photovoltaic element can have two upward-facing water drainage channels, or two downward-facing flanges in its sidelap portions; as long as such photovoltaic roofing elements are properly mated with the corresponding features on adjacent photovoltaic roofing elements, they can be used to construct a water-tight photovoltaic roofing system.

When installed, any water that moves over the lateral edges of the photovoltaic roofing element will be delivered into the water drainage channel, where it can be delivered down the roof. In certain embodiments, the water drainage channel is open at the bottom edge of the frame structure, such that water can flow out of it and down over the next course of photovoltaic roofing elements.

In certain embodiments, the frame structure includes sidewalls that at least partially define the area in which the one or more photovoltaic elements are held. The sidewalls desirably form a substantially closed polygon, e.g., a rectangle formed by sidewalls on all four sides. The sidewalls, e.g., those on the top sidewall and/or the bottom sidewall, can include drainage channels (formed for example as small discontinuities in the sidewalls) to allow water to drain down the roof. In certain embodiments, the sidewalls substantially enclose the area in which the one or more photovoltaic elements are held; and the one or more photovoltaic elements substantially fill the area defined by the sidewalls. For example, the one or more photovoltaic elements and/or a transparent cover element covering the photovoltaic elements desirably fit within 3 mm, within 2 mm, or even within 1 mm of the sidewalls. The sidewalls are desirably in the range of 2 mm-1 cm in height. In certain embodiments, one or more of the sidewalls do not extend beyond the height of the photovoltaic elements (i.e., in the plane of the one or more photovoltaic elements).

One embodiment of the invention is shown in top view and in various partial cross-sectional views in FIG. 1. The photovoltaic roofing element 100 of FIG. 1 includes a frame structure 110 having an upward-facing surface and a downward-facing surface. When the photovoltaic roofing element is installed on a roof, the downward-facing surface generally faces the roof surface, while the upward-facing surface generally toward the sky.

More specifically, in certain embodiments, and in the embodiment of FIG. 1, the frame structure has a sidelap feature 113 at its left side, and a shiplap feature 114 at its right side, equipped with water dams and drainage paths to minimize water intrusion into the roof. The shiplap feature 114 includes a water drainage channel; and sidelap feature 113 includes a downward-facing flange that is configured to fit in the water drainage channel of the shiplap feature of an adjacent photovoltaic roofing element. As will be described in more detail hereinbelow, such photovoltaic roofing elements can be installed on a roof using flashing having coordinating dam and drainage structures. Photovoltaic roofing elements of this type are described in more detail in U.S. Provisional Patent Application Nos. 61/429,053, 61/528,631 and 61/559,614, and in U.S. Patent Application Publications nos. 2012/0210660, 2012/0186630 and 2013/0125482, each of which is hereby incorporated herein by reference in its entirety.

In the embodiment of FIG. 1, the exposure area 116 of the frame structure is equipped with two rows of seven photovoltaic elements 170, each about 5"×5" in dimension. For the sake of clarity, and in order to show the details of the frame structure, only two such photovoltaic elements are shown. The frame structure has a top edge 120, a bottom edge 121, a right edge 122 and a left edge 124. When installed on a roof deck, the top edge is disposed toward the ridge side of the roof deck (i.e., toward its top end), and the bottom edge is disposed toward the eave side of the roof deck (i.e. toward its bottom end). In the embodiment of FIG. 1, near the top end is an attachment zone 126 for fastening the photovoltaic roofing element to a roof structure. A raised lip 128 is provided at the top end of the attachment zone as a dam against water, in order to help prevent moisture intrusion over the upper edge of the photovoltaic roofing element and help to close the roof to the environment. Mounting tabs 129 are provided at several locations across the width of the attachment zone with raised nail bosses, the raised structure providing additional protection from water intrusion through the nail holes. Near the bottom end of the attachment zone is a top sidewall 130, delineating the top edge of the area in which the one or more photovoltaic elements are disposed. Spaced along this top sidewall are drainage openings (e.g., slots or weep holes) 131, such that any water in the attachment zone can drain down the roof over the exposure area 116 of the photovoltaic roofing element.

Figure 1A:
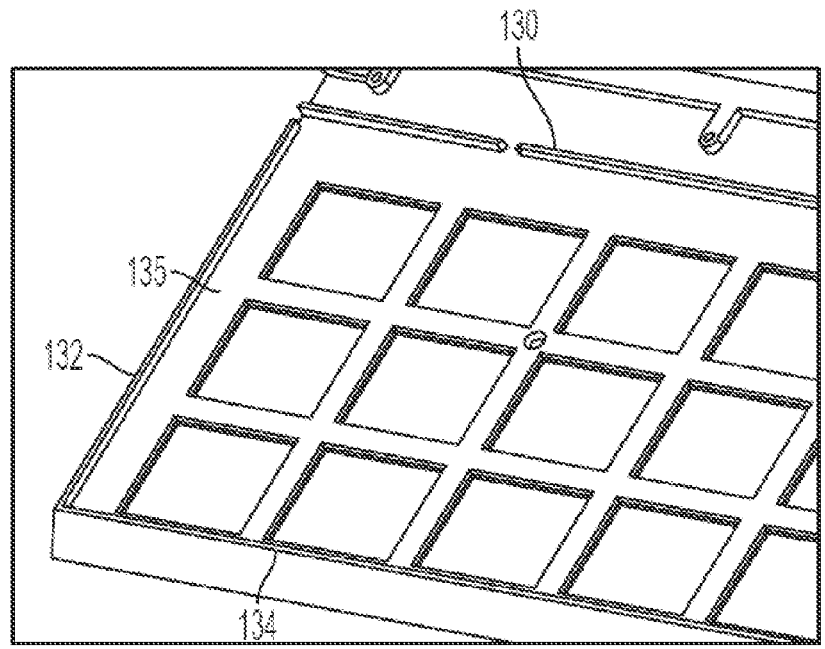
FIG. 1A is a top perspective schematic view of a frame structure suitable for use in a photovoltaic roofing element according to another embodiment of the invention.

A top perspective view of a similar frame structure is shown in FIG. 1A. The frame structure of FIG. 1A includes top sidewall 130, as well as sidewalls 132 and 134, defining the left, and bottom edges of the area in which the one or more photovoltaic elements are disposed. In certain embodiments, a similar sidewall is provided at the right edge of the area in which the one or more photovoltaic elements are disposed (i.e. internally adjacent the shiplap feature as described above with respect to FIG. 1). The frame structure is otherwise similar to that described above with respect to FIG. 1. In other embodiments, no sidewall is provided at the right edge; the left-edge sidewall of an adjacent frame structure provides the fourth sidewall defining the area in which the one or more photovoltaic elements are disposed. In certain embodiments, the sidewalls extend above the upward-facing surface 135 of the area in which the one or more photovoltaic elements are disposed by at least about 1 mm, at least about 2 mm, or even by at least about 3 mm. In certain embodiments, however, the sidewalls extend above the upward-facing surface 135 of the area in which the one or more photovoltaic elements are disposed by no more than about 15 mm, no more than about 10 mm, or even by no more than about 8 mm.

Figure 2:
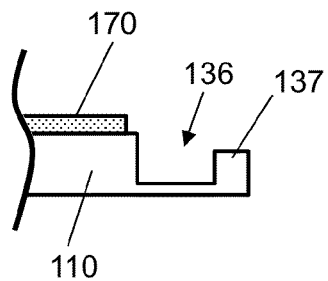
FIGS. 2 and 3 are partial cross-sectional views of the right-hand and left-hand edges of the photovoltaic roofing element of FIG. 1.
Figure 3:
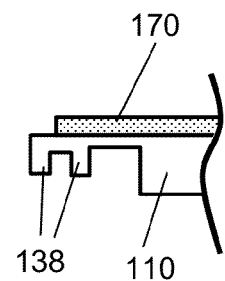

The photovoltaic roofing elements of FIGS. 1 and 1A can be arranged in an array, with laterally adjacent photovoltaic roofing elements being engaged with one another in a shiplap manner. The photovoltaic roofing element has on one side edge (in FIG. 1, the right-hand edge) an upward-facing water drainage channel. FIG. 2 is a cross-sectional view of the photovoltaic roofing element of FIG. 1 in its exposure zone at its right hand edge, in which the frame structure 110, photovoltaic element 170, and upward-facing channel 136 is visible. An outer flange 137 defines the upward-facing water drainage channel. The upward-facing water drainage channel is preferably open at the bottom edge of the photovoltaic roofing element, such that any water entering the gap between adjacent photovoltaic roofing elements is collected therein and conducted down the roof. As shown in FIG. 2, the upward-facing channel is at a lower elevation with respect to the attachment zone. The photovoltaic roofing element has on its opposite side edge (in FIG. 1, the left-hand edge) a downward-facing flange (e.g., a ridge), configured such that the downward-facing flange of one photovoltaic roofing element can engage the upward-facing channel of an adjacent photovoltaic roofing element. FIG. 3 is a cross-sectional view of the photovoltaic roofing element of FIG. 1 in its exposure zone at its left-hand edge, in which two downward-facing flanges 138 are visible. These downward-facing flanges are configured to fit in the upward-facing water drainage channel of an adjacent photovoltaic roofing element.

Notably, in the photovoltaic roofing element of FIGS. 1 and 1A, the frame structure further includes a ledge extending away from the top end of the frame structure and one or more wind clips extending from the downward-facing surface of the frame structure in the exposure zone. This arrangement is shown more clearly in the perspective schematic view of the embodiment of FIG. 4. Ledge 180 is disposed at the top end of the frame structure, extending away from the rest of the frame structure. Wind clips 185 extend from the downward-facing surface of the frame structure in the exposure zone. The wind clips are depicted in more detail in the partial perspective schematic view of FIG. 5. Accordingly, in certain embodiments, the wind clips are disposed substantially beneath the level of the downward-facing surface of the frame structure. The ledge and the one or more wind clips are configured such that, when installed in a photovoltaic roofing system, the wind clip of an overlying photovoltaic roofing element engages the ledge of an underlying photovoltaic roofing element.

Figure 4:
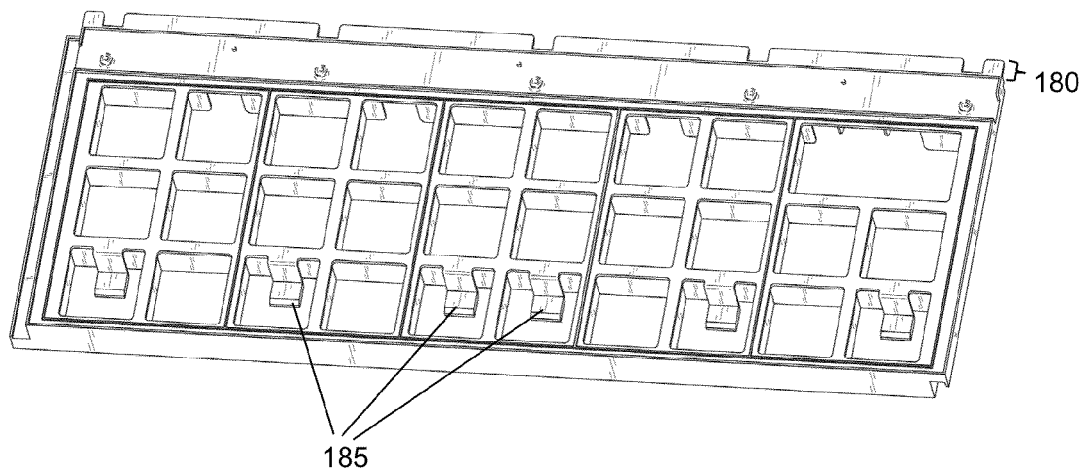
FIG. 4 is a perspective schematic view of a frame structure suitable for use in a photovoltaic roofing element according to another embodiment of the invention.
Figure 6:
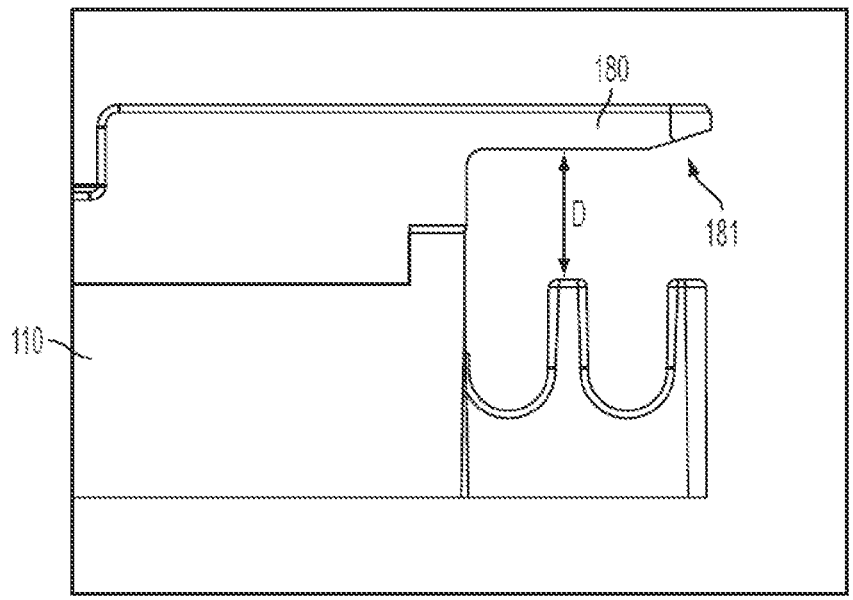
FIGS. 6 and 7 are partial cross-sectional views of the ledge and the wind clip, respectively, of the frame structure of FIGS. 4 and 5.
Figure 7:
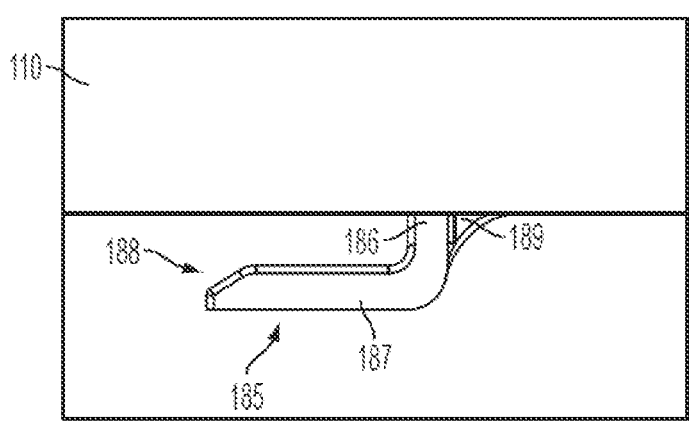
Figure 8:
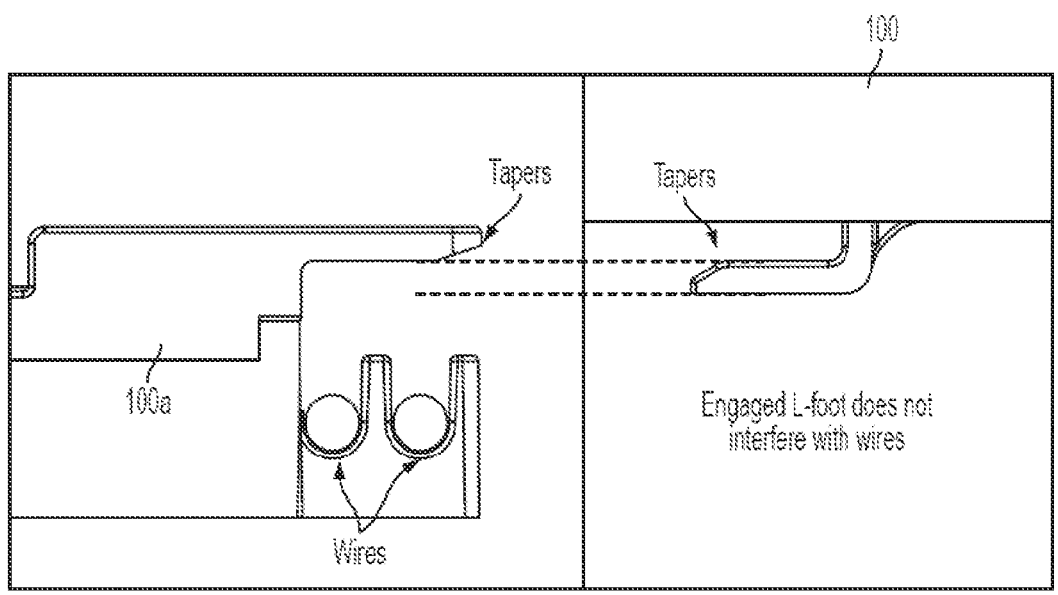
FIG. 8 is a partial cross-sectional view of the ledge of an underlying photovoltaic roofing element and the wind clip of an overlying photovoltaic roofing element aligned for engagement.
Figure 9:
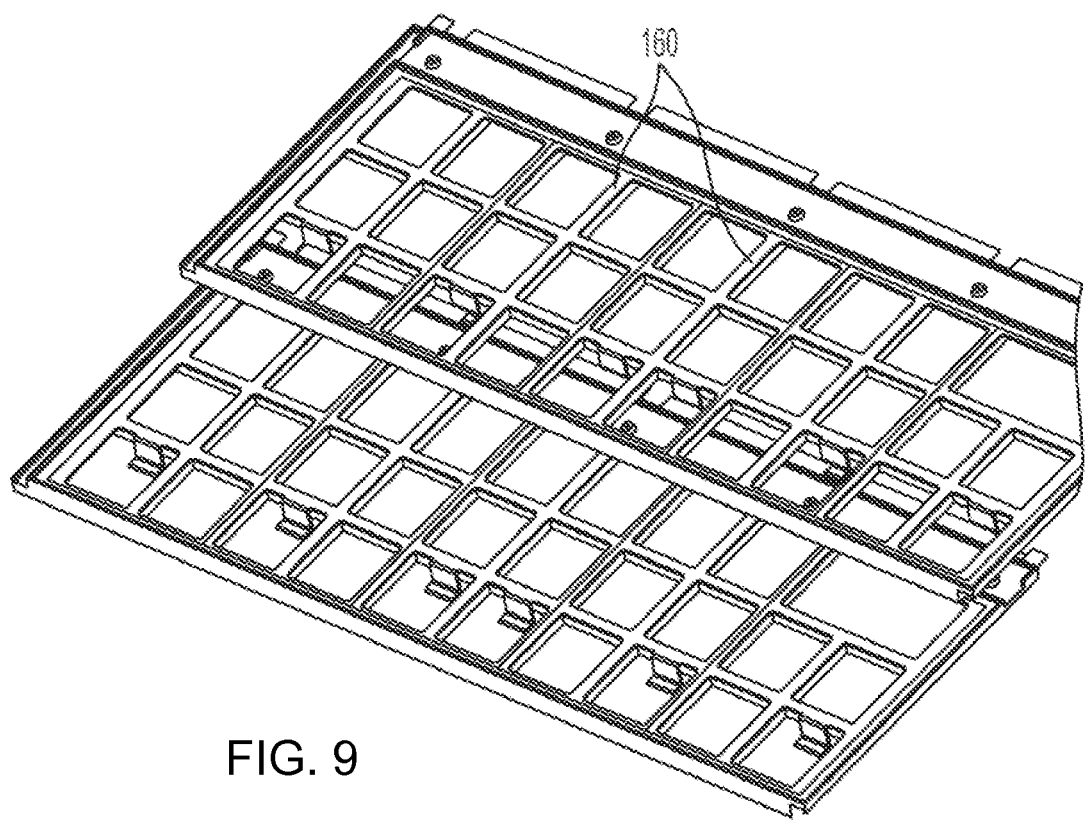
FIGS. 9 and 10 are schematic perspective views (upward and downward, respectively) of an overlying frame structure engaging with an underlying frame structure.
Figure 10:
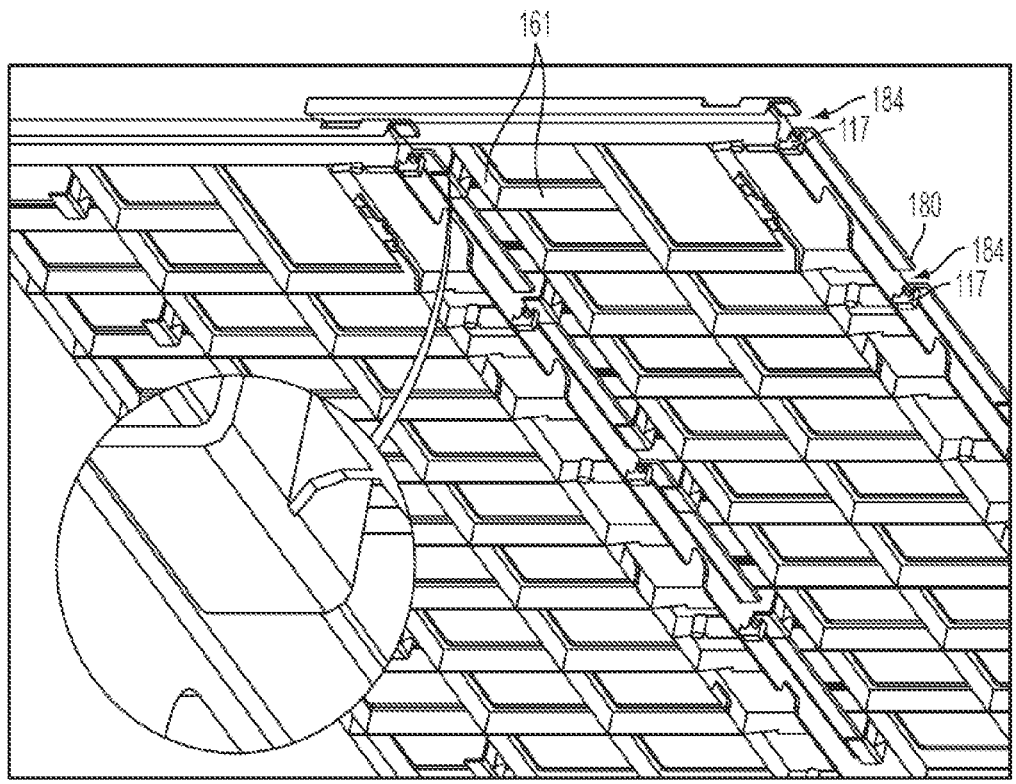
Figure 11:
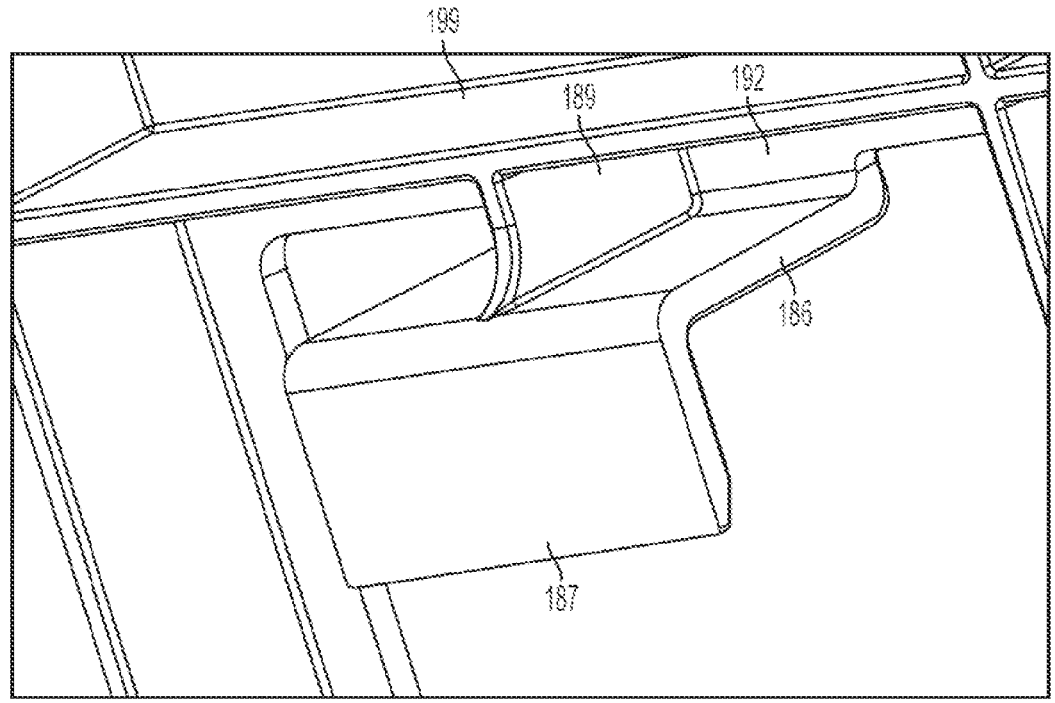
FIG. 11 is a downward perspective view of a wind clip of a frame structure according to one embodiment of the invention.
Figure 32:
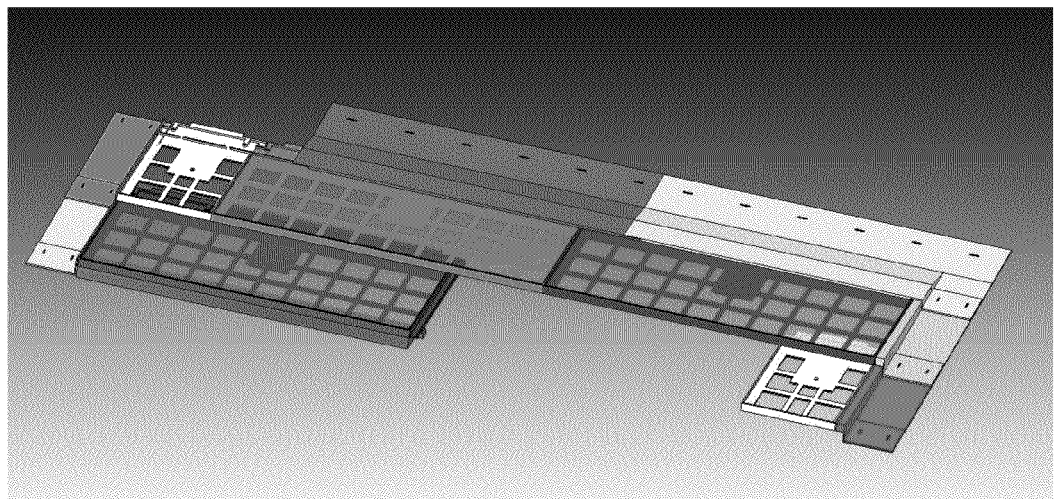
FIG. 32 is a partial schematic perspective view of a photovoltaic roofing system according to one embodiment of the invention.

In certain embodiments, each of the wind clips includes a feature extending substantially horizontally toward the bottom end of the frame structure, the feature being configured such that, when installed in a photovoltaic roofing system, the horizontal feature of an overlying photovoltaic roofing element is disposed under the ledge of an underlying photovoltaic roofing element. For example, in certain embodiments, each of the wind clips includes a feature extending substantially vertically downward from the downward-facing surface of the frame structure, and a feature extending from the downward end of the vertically-extending feature substantially horizontally toward the bottom end of the frame structure, the horizontally-extending feature being configured such that, when installed in a photovoltaic roofing system, the horizontal feature of an overlying photovoltaic roofing element is disposed under the ledge of an underlying photovoltaic roofing element. The ledge and the wind clip of the embodiment of FIG. 4 are shown in cross-sectional schematic view in FIGS. 6 and 7, respectively. Accordingly, in this embodiment, the ledge 180 extends away from the top end of the frame structure 110. In certain embodiments, and as shown in FIG. 6, the ledge is formed at the upward-most surface of the top end of the frame structure. As shown in FIG. 7, the wind clip 185 includes a feature 186 extending substantially vertically downward from the downward-facing surface 192 (see FIG. 11) of the frame structure 110, and a feature 187 extending from the downward end of the vertically-extending feature 186, the feature 187 extending substantially horizontally toward the bottom end of the frame structure. As the person of ordinary skill in the art will appreciate, the vertically- and horizontally-extending features need not be formed at right angles to one another, and the vertically-extending feature need not be formed at a right angle with the downward-facing surface of the frame structure. FIG. 8 is a schematic cross-sectional view of a wind clip of an overlying photovoltaic roofing element 100 aligned for engagement with the ledge of an underlying photovoltaic roofing element 100a. FIGS. 9 and 10 are schematic perspective views (upward and downward, respectively) of an overlying frame structure engaging with an underlying frame structure (photovoltaic elements are not shown for purposes of clarity). In the embodiments of FIGS. 9 and 10, there is no lateral offset between the overlapping photovoltaic roofing elements. Of course, the person of ordinary skill in the art will appreciate that in other embodiments, there is a lateral offset between overlapping courses of photovoltaic roofing elements, e.g., as shown in FIG. 32. In such cases, one or more wind clips of an overlying photovoltaic roofing element can engage the ledge of a first underlying photovoltaic roofing element, and one or more wind clips of the overlying photovoltaic roofing element can engage the ledge of a second underlying photovoltaic roofing element, disposed laterally adjacent to the first underlying roofing element.

In certain embodiments, the ledge, the wind clip(s), or both the ledge and the wind clips have tapers formed therein, to aid in alignment and mating of the ledge with the wind clip. For example, as shown in the cross-sectional views of FIGS. 6-8, the ledge has a taper in thickness at its distal end, indicated by reference number 181, and the wind clip has a taper in thickness at its distal end, indicated by reference number 188.

Each wind clip can be formed in a variety of shapes and sizes. For example, while the horizontally-extending feature is shown in various Figures to be rectangular in shape, the person of ordinary skill in the art will appreciate, that the horizontally-extending feature can be formed in other shapes, e.g., trapezoidal, semicircular or triangular. In certain embodiments, the horizontally-extending feature of each wind clip has a surface area (i.e., on its upward-facing surface) in the range of about 1 cm$^2$ to about 20 cm$^2$, or about 1.5 cm$^2$ to about 10 cm$^2$, or about 2 cm$^2$ to about 8 cm$^2$. In other embodiments, the horizontally-extending feature of each wind clip has a width (i.e., in the lateral direction) in the range of about 1 cm to about 8 cm, or about 1.5 cm to about 6 cm; and a length (i.e., in the top end to bottom end direction) of about 1.5 cm to about 8 cm, or about 1.5 cm to about 5 cm. In certain embodiments, the total area of the horizontally-extending features of all wind clips of a particular photovoltaic roofing element is greater than about 5 cm$^2$, greater than about 10 cm$^2$, greater than 20 cm$^2$, or even greater than about 30 cm$^2$. Use of such large surface areas can help to distribute the load created by wind uplift over a greater surface area, increasing the holding power of the wind clips. The horizontally-extending feature of each wind clip can have, for example, a thickness in the range of about 1 mm to about 15 mm, e.g., about 1 mm to about 10 mm, or even about 2 mm to about 5 mm. As described in more detail below, using relatively thin wind clips can allow the wind clip to engage the ledge of an underlying photovoltaic roofing element without interfering with wiring that may be disposed at the top end of the frame structure.

Similarly, the ledge can be formed in a variety of shapes and sizes. For example, in certain embodiments, the ledge has a length (i.e., in the top end to bottom end direction) of about 1.5 cm to about 8 cm, or about 1.5 cm to about 5 cm. In certain embodiments, the length of the ledge is greater than the length of the horizontally-extending feature of one or more of the wind clips (e.g., of each of the wind clips). In certain such embodiments, a vertically-extending feature of the wind clip can act as a positive "stop," such that the vertical feature of an overlying photovoltaic roofing element is disposed substantially against the ledge of an underlying photovoltaic roofing element, thereby indicating that the tiles are fully engaged. This can be especially advantageous because the ledge can be formed at a location removed from the wiring, and thus the use of the positive stop would have little risk of pinching any wiring. Of course, in other embodiments, the ledge (or some other part of the frame structure) can be provided with a stop for the wind clip. In either event, the stop can be used to ensure that overlying courses of photovoltaic roofing elements are positioned consistently with respect to underlying courses of photovoltaic roofing elements.

Figure 12:
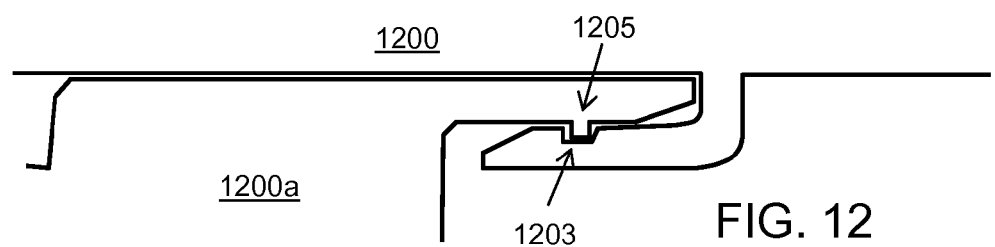
FIGS. 12-14 are partial schematic cross-sectional views of engaged photovoltaic roofing elements showing various combinations of wind clips with ledges.
Figure 13:
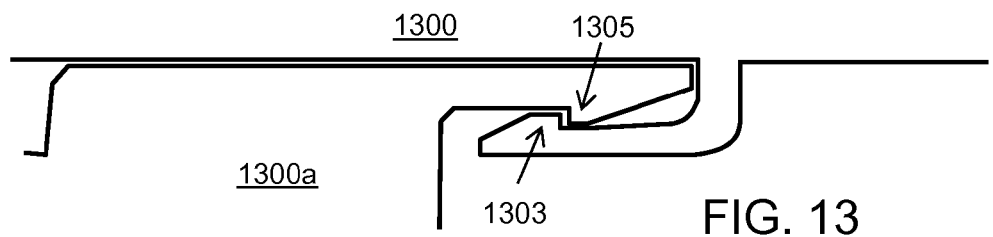
Figure 14:
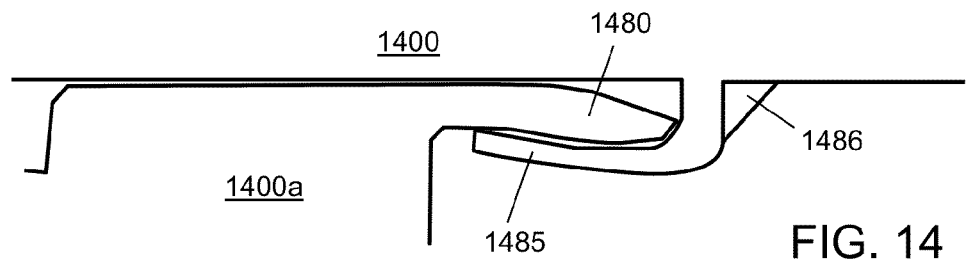

In certain embodiments, and as described above with respect to FIGS. 6-8, the wind clips and ledges are formed as relatively flat, extending flanges. One such embodiment is shown in the perspective view of FIG. 11. In other embodiments, the wind clips and ledges include detent features and/or locking features, e.g., matching bumps, ridges or grooves that can provide a measure of positive "locking" to the engagement and/or provide the feel or sound of "snapping" into place when an overlying photovoltaic roofing element is correctly positioned with respect to an underlying photovoltaic roofing element. In other embodiments, the wind clip, the ledge, or both are tapered to provide a spring lock, or formed in the shape of a slight curve or shallow hook to lock the pieces together when mated with a corresponding geometry in the wind clip or ledge. Various embodiments are shown in partial schematic cross-sectional view in FIGS. 12-14. In the embodiment of FIG. 12, the wind clip of the overlying photovoltaic roofing element 1200 includes a groove 1203, into which a corresponding ridge 1205 on the ledge of the underlying photovoltaic roofing element 1200a fits when the parts are correctly assembled. In the embodiment of FIG. 13, the wind clip of the overlying photovoltaic roofing element 1300 and the ledge of the underlying photovoltaic roofing element 1300a include features 1303 and 1305 that spring together when the parts are correctly assembled. In the embodiment of FIG. 14, the wind clip 1485 of the overlying photovoltaic roofing element 1400 curves slightly upwardly, while the ledge 1480 of the underlying photovoltaic roofing element 1400a curves slightly downwardly. In such embodiments, the person of ordinary skill in the art can select materials and thicknesses to provide the desired combination of rigidity and flexibility to provide a desired amount of spring action. Moreover, FIG. 14 shows the use of a gusset 1489 providing additional rigidty to the wind clip.

Figure 14A:
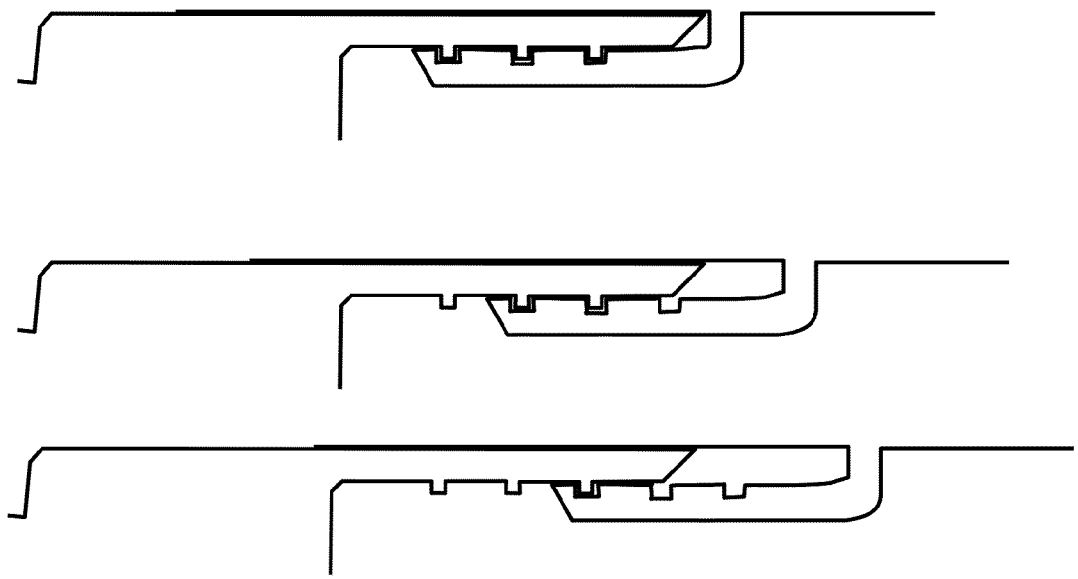
FIGS. 14A-14E are partial schematic cross-sectional views of engaged photovoltaic roofing elements showing various combinations of wind clips with ledges.
Figure 14B:
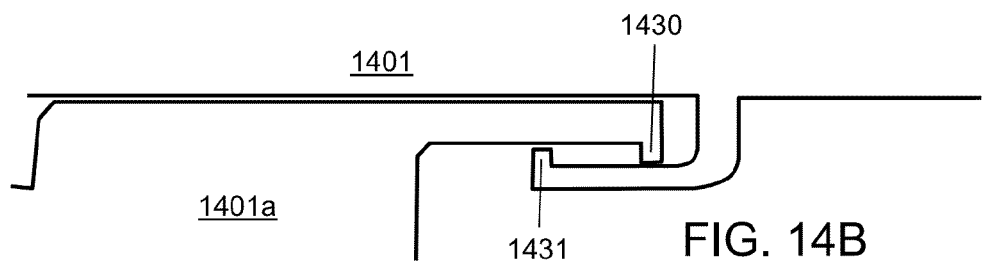
Figure 14C:
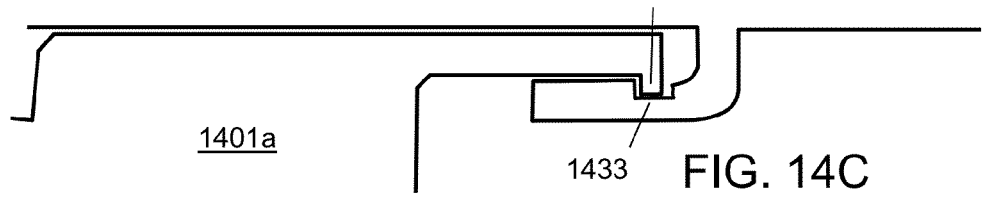

In certain embodiments, the ledge, the wind clip or both include ridges, channels and/or detent features that provide multiple stops, so as to provide a variety of stopped positions. Thus, the installer can choose from a plurality of positions for the wind clip relative to the ledge, and thus from a plurality of positions of an overlying photovoltaic roofing element with respect to an underlying photovoltaic roofing element. For example, the ledge and the wind clip can provide stops every quarter inch, e.g., to provide an exposure of 13.25", 13.5" and 13.75" for the underlying photovoltaic roofing element. An example is shown in partial schematic cross-sectional view in FIG. 14A. While the embodiment of FIG. 14A has ridges on the ledge and channels in the wind clip, the person of ordinary skill in the art will appreciate that ridges can be formed in the ledge and channels can be formed in the wind clip.

Figure 14D:
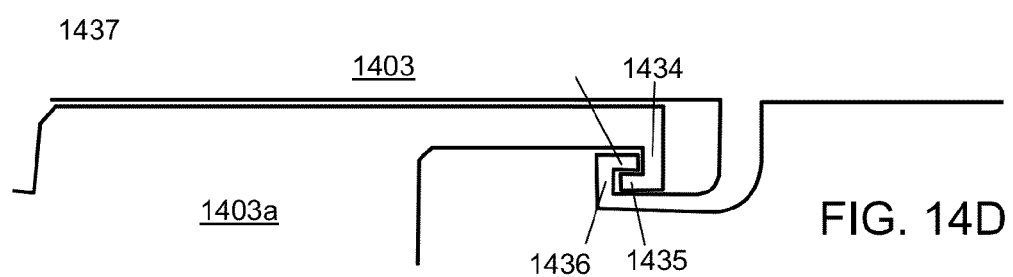
Figure 14E:
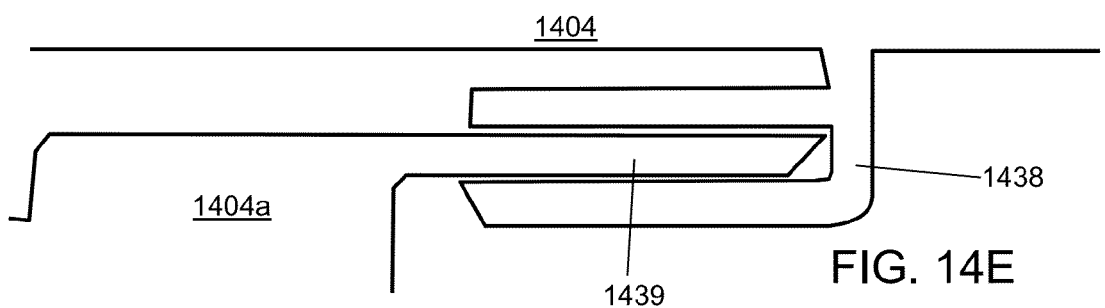

Additional embodiments of wind clips and ledges are shown in the embodiments of FIGS. 14B-14E. For example, in the embodiment of FIG. 14B, the ledge of the underlying frame structure 1401a has a downward-facing feature 1430 (e.g., a ridge) extending from the top edge thereof. The wind clip has an upward-facing feature 1431 (e.g., a ridge) at its distal edge. The ridges can interact to provide a positive lock when the parts are properly engaged. Similarly, in the embodiment of FIG. 14C, the ledge of the underlying frame structure 1401a has a downward-facing feature 1430 (e.g., a ridge) extending from the top edge thereof. The wind clip as an upward-facing channel 1433 formed therein, in which the downward-facing feature of the ledge of the overlying structure can fig. Here, too, the parts can interact to provide a positive lock when the parts are properly engaged. In the embodiment of FIG. 14D, the ledge of the underlying frame structure 1401a has a downward-facing feature 1434 (e.g., a ridge) extending from the top edge thereof, which has an inward-facing feature 1435 (e.g., a ridge) extending from the downward edge thereof. The wind clip has an upward-facing feature 1436 (e.g., a ridge) at its distal edge, from which an inward-facing feature 1437 (e.g., a ridge) extends. Here the parts can interlock to provide a stronger interaction. In FIG. 14E, the wind clip 1438 of the overlying photovoltaic roofing element 1404 includes two flanges, one that goes under the ledge 1439 of the underlying photovoltaic roofing element 1404a as described herein, and one that goes over the ledge.

Figure 5:
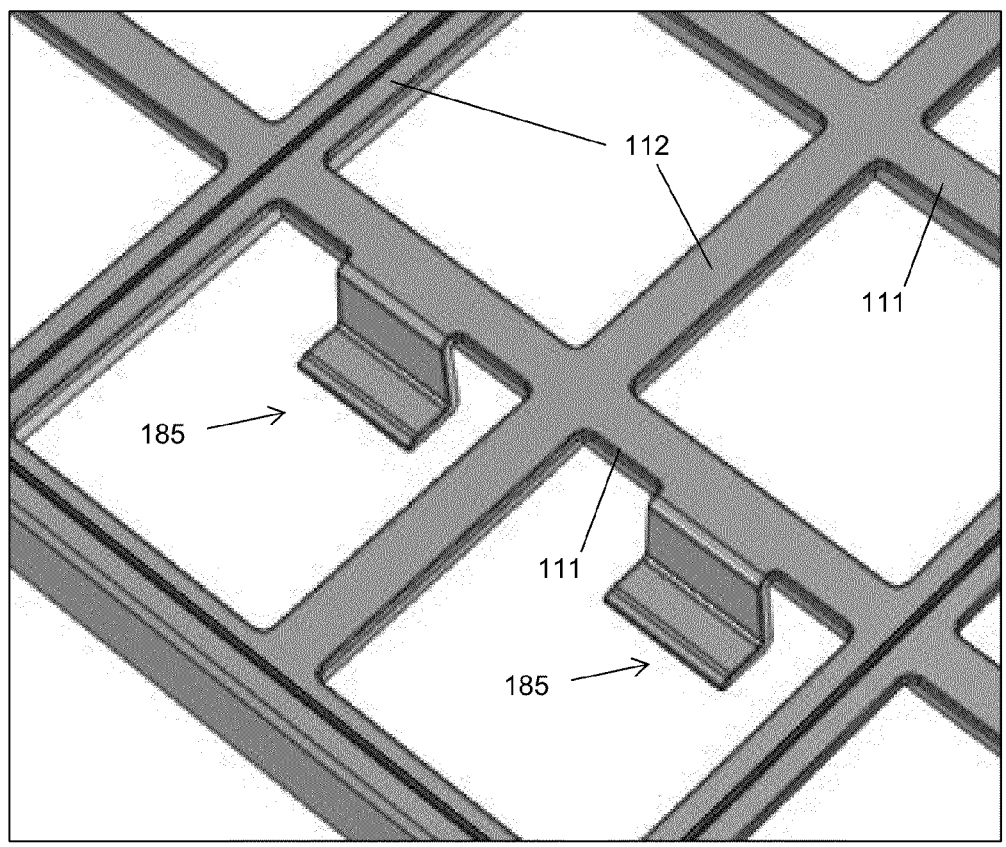
FIG. 5 is partial perspective schematic view of the frame structure of FIG. 4.

In certain embodiments, the exposure zone of the frame comprises a plurality of horizontal support structures and a plurality of vertical support structures intersecting with the horizontal support structures, the one or more photovoltaic elements being disposed on the support structures, the horizontal and vertical support structures defining the downward-facing surface of the frame structure. For example, in the embodiment shown in partial top perspective view of FIG. 5, a frame includes a plurality of horizontal support structures 111 and a plurality of vertical support structures 112 intersecting with the horizontal and vertical support structures define the downward-facing surface of the frame structure. The horizontal and vertical support structures define the downward-facing surface of the frame structure (see FIG. 10). When assembled into a photovoltaic roofing element, the one or more photovoltaic elements are disposed on the support structures. The support structures can have slat-shaped upward-facing surfaces 160, as shown in FIGS. 5 and 9, in order to provide a flat surface for disposal of the photovoltaic elements. One or more of the support structures can also include one or more ribs 161 extending downwardly from the slat-shaped upward-facing surfaces (e.g., to provide a "T-shaped" cross-section to the support structure), as shown in FIG. 10.

It will be noted that the downward-facing surfaces of many of the photovoltaic roofing elements as described herein have a plurality of downward-facing support structures, here, ribs formed in a grid structure. The downward-facing support structures serve to reduce the amount of material necessary to provide a supportive frame structure. They also provide a degree of rigidity to minimize flexing so that the photovoltaic elements are supported with minimal deformation stresses imparted; this can be especially important when rigid photovoltaic elements are used. Moreover, thermal expansion and contraction effects can also be balanced in part by such a structure. The ribbed structure can also provide locations for securing junction boxes and electrical components for the photovoltaic elements held by the frame structure. In the embodiments shown in the Figures the support structures are intersecting ribs, but the person of skill in the art will appreciate that other structures could be used.

In certain embodiments, and as shown in FIGS. 5 and 10, the one or more wind clips extend downwardly from one of the horizontal support structures. In this configuration, wind clips can be located at a wide variety of lateral positions along the downward-facing surface of the frame structures, regardless of the locations of the vertical support structures. This can allow additional design flexibility, and the use of larger and more numerous wind clips as compared to designs in which the wind clips are attached to the vertical support structures.

Accordingly, in certain embodiments, the one or more wind clips extend downwardly below the downward-facing surface of the remainder of the frame structure. This can be advantageous, in that the rest of the frame structure will not interfere with the mating of the wind clips to the ledge of an underlying photovoltaic roofing element. Moreover, when the clips extend downwardly from one of the horizontal support structures, a simpler and less expensive molding process can be used, as there is no undercutting of the structure (as compared to the case when the clips are formed on a vertical support structure, where the vertical support structure and the clip would form an undercut, requiring a specialized mold in order to eject the part). Accordingly, in certain embodiments, the horizontally-extending features of the wind clips have substantially no other part of the frame structure disposed in an upward direction from them.

The wind clip can be stabilized by a gusset connecting the vertically-extending feature to the frame structure. For example, in the embodiment of FIG. 7, a gusset 189 connects the vertically-extending feature 186 to the frame structure 110. For example, as shown in the downward perspective view of FIG. 11, when the frame structure includes a "T-shaped" support structure as described above, the gusset can connect the vertically-extending feature to a horizontally-extending slat 192, a horizontally- and downwardly-extending rib 199, or both. The use of the gusset can strengthen the overall structure, further helping to prevent wind uplift and allowing relatively less material to be used in the remainder of the frame structure. Advantageously, when the wind clip extends from a horizontally-extending support structure, there is space for multiple gussets to be used.

In certain embodiments, the frame structure further includes one or more wiring containment structures, disposed along the top end of the frame structure, downward relative to the ledge. Such an embodiment is shown in perspective view in FIG. 10. Frame structure 110 includes wiring containment structures (here, discrete wiring holders 117), disposed along the top end of the frame structure, downward relative to the ledge 180. The distance between the ledge and the wiring containment structure(s) (e.g., in the upward-downward direction, as indicated by arrow "D" in FIG. 6) can be, for example, at least about 1 cm, at least about 1.5 cm, or even at least about 2 cm, in order to provide sufficient clearance for installation of wires or cables into the wiring containment structure without interfering with the engagement of the ledge with the wiring clip of an overlying photovoltaic roofing element.

Figure 10A:
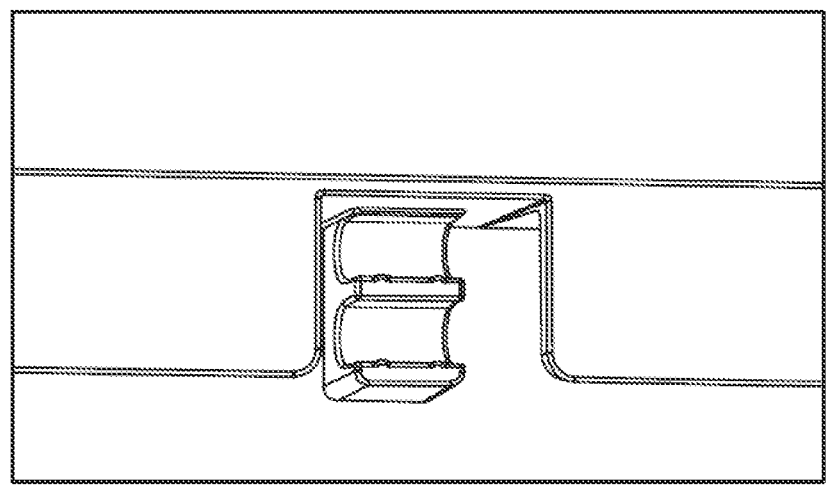
FIG. 10A is a top partial view of a frame structure according to one embodiment of the invention.
Figure 15:
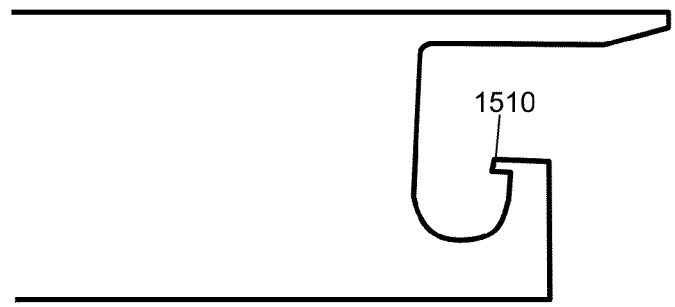
FIG. 15 is a partial cross-sectional view of the top end of a frame structure according to one embodiment of the invention.

As the person of ordinary skill in the art will appreciate, the wiring containment structure(s) can take a variety of forms. For example, the person of skill in the art can determine the length and position of the wiring containment structure, depending, for example, on the particular wiring scheme used for the overall photovoltaic roofing system envisioned. The wiring containment structure can be formed, for example, as a plurality of upward-facing wiring holders, as shown in FIG. 10. In alternative embodiments, the wiring containment structure can be formed as an upward-facing channel or tray (e.g., as shown in FIG. 6, with the structure extending along the top end of the frame structure. In certain embodiments, and as shown in the partial cross-sectional view of FIG. 15, the edges of the opening of the wiring holder or the wiring channel can be somewhat more narrow than the rest of the channel (and of the wiring to be contained therein), such that the wiring can "snap" in. As shown in FIG. 15, the wiring containment structure can have a tab 1510 (formed continuously along the structure, or as one or more discrete tabs) that can act to retain the wiring in place in the structure. The person of ordinary skill in the art can select materials and thicknesses to provide the desired combination of rigidity and flexibility to provide a desired amount of "snapping" action. In other embodiments, wiring can be held in the wiring containment structure in other ways, for example using an adhesive, or using post-applied retaining elements such as fasteners. The wiring containment structure shown in FIGS. 6, 8 and 10A has upward-facing features for holding wires. Of course, as the person of ordinary skill in the art will appreciate, the wiring containment structures can be configured to hold wiring in a different fashion. For example, the wiring containment structures can have features that face downward to hold the wires, for example, against the surface of the roof deck. In other embodiments, the features can open toward the top edge or toward the bottom edge of the photovoltaic roofing element. The person of ordinary skill can adapt the wiring containment structures described below with respect to FIGS. 48-56 for use as a wiring containment structure disposed below the ledge at the top end of the photovoltaic roofing element.

In certain embodiments, and as shown in FIGS. 9 and 10, in certain embodiments, the ledge is formed discontinuously along the top end of the frame structure, i.e., it has one or more "breaks" formed therein. In the embodiment of FIG. 10, breaks are indicated by reference numeral 184. The breaks can be formed, for example, in registration with the one or more wiring containment structures, to provide for easy upside access to the wiring containment structures for installation of wiring, as additionally shown in the top view of FIG. 10A. In some circumstances (e.g., depending on the shape of the wiring containment structure, the gaps can also allow for simpler fabrication via molding without an undercut. In certain embodiments, each break is less wide (i.e., in the lateral direction) than the one or more wind clips (e.g., less wide than the horizontally extending structure thereof). Each break can, for example, have a width greater than about 5 mm, and less than about 60% of the width of each the break is no more than about 60% of the width of the horizontally-extending structure of the wind clip. Thus, the wind clips will reliably engage the ledge even when in the neighborhood of a break. This enables adjacent courses of photovoltaic roofing elements to be offset by any distance without affecting the ability of the wind clips to engage the ledge and provide resistance to wind uplift. Accordingly, while the photovoltaic roofing elements can be offset like conventional flat concrete tiles (e.g., by about 6"), the person of ordinary skill in the art can select virtually any desired offset.

Figure 16:
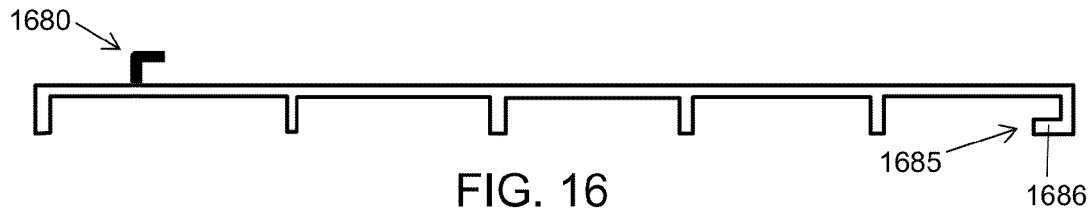
FIG. 16 is a cross-sectional schematic view of a frame structure for a photovoltaic roofing element according to another embodiment of the invention.
Figure 17:
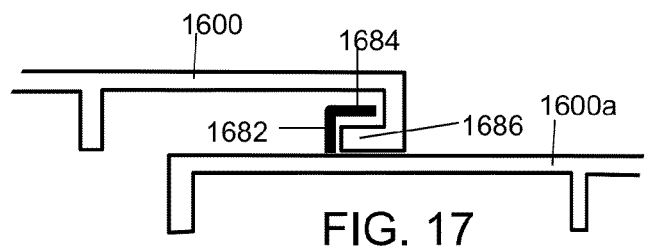
FIG. 17 is a partial schematic cross-sectional view of two photovoltaic roofing elements of FIG. 16 mating with one another.

Another embodiment of the invention is shown in cross-sectional schematic view in FIG. 16. In this embodiment, a photovoltaic roofing element includes a frame structure having a top end and a bottom end, and an upward-facing surface and a downward-facing surface, the frame structure having an attachment zone and an exposure zone, with the exposure zone disposed toward the bottom end of the frame structure, and the attachment zone disposed toward the top end of the frame structure, for example, as described above with respect to FIGS. 1 and 1A. As shown in FIG. 16, the frame structure 1610 further includes an L-shaped ridge 1680 extending laterally on its upward-facing surface in the attachment zone, the L-shaped ridge comprising a feature extending substantially vertically from the upward-facing surface and a feature extending from the upward end of the vertically-extending feature substantially horizontally toward the bottom end of the frame structure, the frame structure further comprising one or more wind clips 1685 formed on the underside of the frame structure at its bottom end, each wind clip comprising a feature 1686 extending substantially horizontally toward the top end of the frame structure. FIG. 17 is a partial schematic cross-sectional view of two such photovoltaic roofing elements mating with one another. Here, the L-shaped ridge and the one or more wind clips are configured such that, when installed in a photovoltaic roofing system, the horizontal feature 1686 of each wind clip 1685 of the overlying photovoltaic roofing element 1600 is disposed under the horizontally-extending feature 1686 of the L-shaped ridge 1680 of the underlying photovoltaic roofing element 1600*a*. The ends of the horizontally-extending features can be tapered as described above. Similarly, the horizontally-extending features can be provided with structural elements such as grooves, bumps, ridges or curvature in order to provide a positive or "snap" lock. The use of a continuous L-shaped ridge can serve as a water dam to prevent wind-driven rain from working its way over the top of then under the photovoltaic roofing elements.

In certain embodiments, and as shown at the lower edge of the photovoltaic roofing element of FIG. 1, a leading edge extension 140 is provided to cover an upper portion of a photovoltaic roofing element of an underlying course of photovoltaic roofing elements. When installed in an array, the leading edge extension 140 can extend substantially to the exposure zone of an underlying course of photovoltaic roofing elements, to improve conduction of water down the roof. In certain embodiments, the leading edge extension does not span the entire length of the frame structure; for example, as shown in FIG. 1, it can be missing in one of the sidelap portions, such that the leading edge extensions of adjacent photovoltaic roofing elements do not interfere with one another. In certain embodiments, the leading edge extension includes a recess on its downward-facing surface, to accommodate the raised lip 128 at the top end of the attachment zone of an overlying photovoltaic roofing element, thereby forming part of the water barrier system between the panels. In use, the leading edge extension can be covered by the one or more photovoltaic elements; it need not be a visually distinct feature. Of course, in other embodiments, the sidelap and shiplap features can extend the entire height of the frame structure, so that the entire height of the side edges of adjacent elements interlock to one another.

Figure 18:
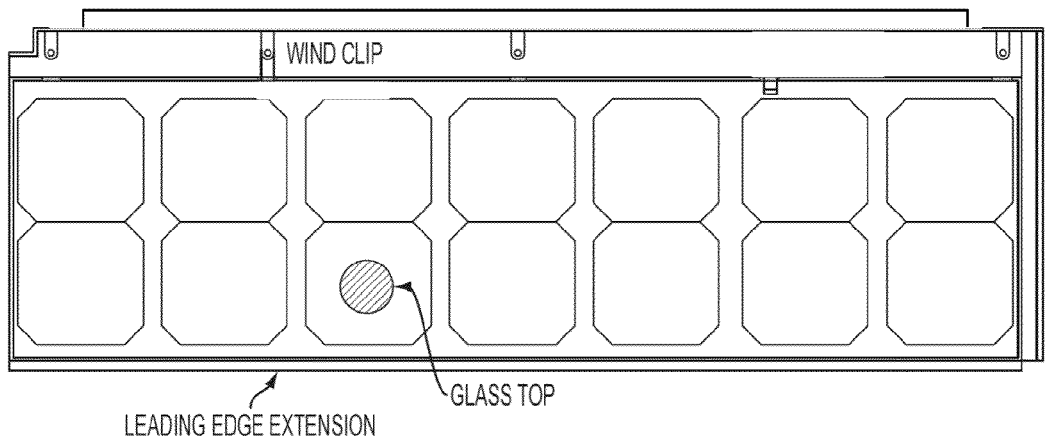
FIG. 18 is a top view of a photovoltaic roofing element according to another embodiment of the invention.

FIG. 18 is another top schematic view of the photovoltaic roofing element of FIGS. 1 and 1A with a rigid photovoltaic element (e.g., a module including the two rows of seven photovoltaic cells as described above, with a tempered glass top cover to protect the cells). Cells are laterally spaced at intervals of about ¾ inch. The cells are inset from the top and bottom edges of the module by about ½ inch and from the left and right side edges by about ⅜ inch. Preferably, the cells of the module are inset from the edges of the module sufficiently to conform to UL, NEC or other electrical code requirements. The module is set into the panel in the area formed by the sidewalls and sealed in place with an appropriate sealant, e.g., as a perimeter ridge surrounding the module. The photovoltaic element (here, the module as defined by its tempered glass cover) will preferably be within 3 mm, within 2 mm, or even within 1 mm of the sidewalls. Preferably, the ridge running along the top edge of the module provides a raised lip at the lower edge of the attachment zone and has drainage openings as described above to provide drainage over the top surface of the module in the exposed area of the photovoltaic roofing element.

Figure 19:
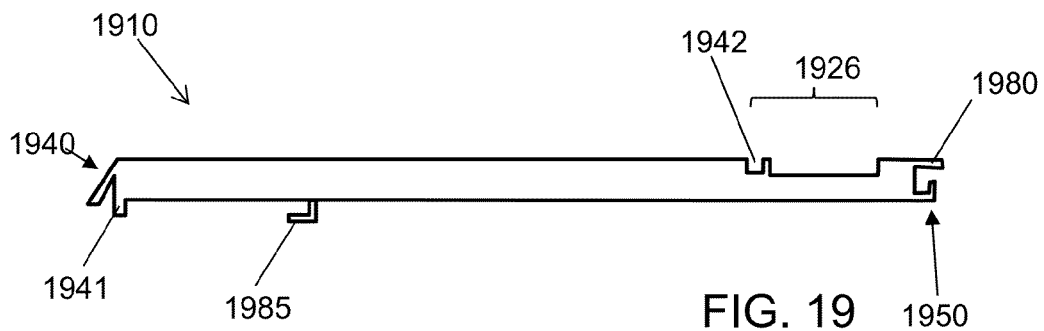
FIG. 19 is a schematic cross-sectional view of a frame structure according to one embodiment of the invention.

In FIG. 18, the bottom edge of the photovoltaic roofing element is formed by the leading edge extension, but as described above, in some embodiments, no leading edge extension is at the bottom edge of the photovoltaic roofing element. The bottom edge of the overlying photovoltaic roofing element preferably covers the horizontal-running seam where the photovoltaic element is disposed in the frame structure (i.e., along the top sidewall). FIG. 19 is a partial schematic side view of a frame structure 1910 suitable for use in certain embodiments of the invention. As described above, the frame structure includes a ledge 1980 and a wind clip 1985. A leading edge extension 1940 at the bottom side of the photovoltaic roofing element is at the left edge of the diagram; and the attachment zone 1926 at the top side is at the right. The framing structure includes an upward-facing channel 1950 that can act as a wiring containment structure. In certain embodiments, and as shown in FIG. 19, a ridge 1941 is formed on the downward-facing surface of the framing structure 1910 toward its bottom end. The ridge 1941 is adapted to fit into a corresponding channel 1942 formed in the upward facing surface of an underlying panel, at the interface between the attachment zone and the exposure zone. The interlocking of the ridge 1941 into the channel 1942 can provide additional water resistance to an array of photovoltaic roofing elements by providing a circuitous path for water, thereby preventing intrusion of water and wind-driven rain to the roof deck. The downward-facing surface of framing structure of FIG. 19 also includes a wiring containment channel 1950, into which wiring can fit, so that the framing structure does not pinch it against the roof Top and bottom sidewalls are not shown in the embodiment of FIG. 19, but could be included as the person of skill in the art would realize in view of the present disclosure and in view of the disclosures of U.S. Provisional Patent Application Nos. 61/429,053, 61/528,631 and 61/559,614, and U.S. Patent Application Publications nos. 2012/0210660, 2012/0186630 and 2013/0125482.

Figure 20:
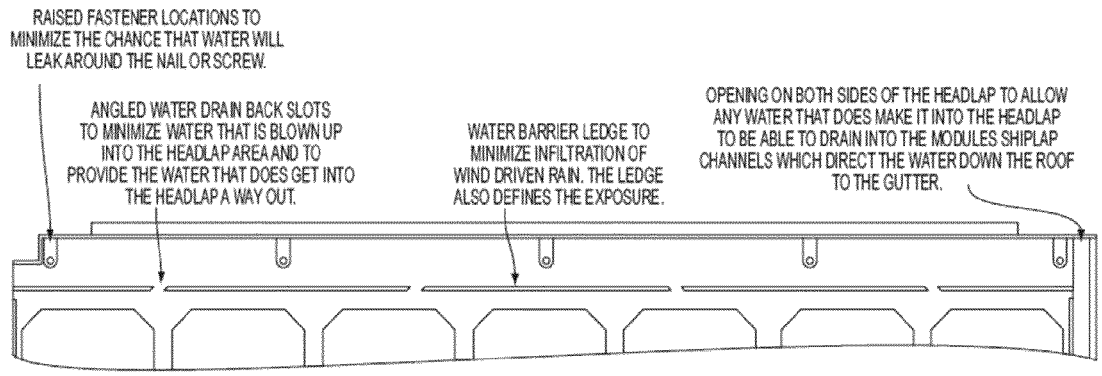
FIG. 20 is a schematic plan view of a frame structure according to one embodiment of the invention.

FIG. 20 is a top schematic view of the headlap portion and attachment zone of an example of a photovoltaic roofing element, with emphasis on a number of optional features that can help prevent water ingress. The raised fastener locations can minimize water leakage around the nail or screw used to attach the photovoltaic roofing element to a roof. The top sidewall (i.e., the "water barrier rib" in the figure) acts as a wall or dam to minimize infiltration of wind driven rain. The rib in this case also serves to define the location of edge of the exposure area and, in certain instances, can cooperatively interact with an overlying photovoltaic roofing element to ensure proper location of the next course (e.g., as described above with respect to FIG. 19). The drainage slots in the water barrier rib are angled to prevent water being blown up into the attachment zone, while providing an exit path for water that may enter the attachment zone. Water exiting through the drainage slots or weep holes would proceed down the roof over the top of the exposure area of the photovoltaic roofing element. In certain embodiments, at least one lateral side edge of the attachment zone does not include a sidewall, such that water in the attachment zone can flow off of the side thereof (e.g., into a channel formed by a shiplap feature as described above). In other embodiments, a lateral side edge sidewall includes drainage channels to allow water to drain off the side of the photovoltaic element. In the embodiment shown in FIG. 20, the lateral sides of the attachment zone are not dammed off, such that any water that does make it into the attachment zone can to drain into the photovoltaic roofing element's shiplap drainage channels. Water exiting to the right side of the photovoltaic roofing element shown would directly enter its own drainage channel. Water exiting to the left side would enter the drainage channel of the left adjacent photovoltaic roofing element. In certain embodiments, similar drainage can be achieved if the sidewalls do not extend beyond the top surface of the photovoltaic element.

FIG. 18 shows a top plan view of a photovoltaic roofing element similar to those of FIGS. 1, 1A and 2, but where the size and shape of the exposure zone has been adjusted to accommodate a photovoltaic module having two rows of six inch photovoltaic cells. The configuration of FIG. 18 has a greater surface area of active photovoltaic media than that of FIGS. 1 and 1A. Of course, the person of skill in the art will appreciate that a variety of configurations and spacings of photovoltaic cells and modules can be used in practicing certain aspects of the present invention. Moreover, the person of skill in the art will appreciate that a wide variety of photovoltaic cells and modules can be used in practicing the present invention. The embodiments of FIGS. 1, 2 and 21 are described as using rigid photovoltaic elements. In other embodiments according to certain aspects of the invention, the photovoltaic elements are flexible photovoltaic elements, for example, encapsulated flexible photovoltaic elements.

The frame structures may further include a variety of additional features, as described in more detail below. The person of ordinary skill in the art will understand that for the sake of simplicity, many of the Figures described herein do not explicitly depict a ledge, a wind clip or an L-shaped element as described above, but that such features can be included in a frame structure or photovoltaic roofing element as otherwise described herein.

As described above with respect to FIG. 1A, in certain embodiments, the exposure zone includes raised sidewalls that define the area in which the photovoltaic elements are disposed. The area of the frame in which the one or more photovoltaic elements are disposed includes an upward-facing base surface 135, forming the base on which the photovoltaic elements are disposed, and the sidewalls extend above the upward-facing surface 135 by at least about 2 mm, or even by at least about 3 mm. Advantageously, the sidewalls can enable an adhesive used to adhere the photovoltaic element to the frame to encapsulate part of the edge of the photovoltaic element, thus sealing and protecting it and reducing potential susceptibility to moisture intrusion.

Figure 21A:
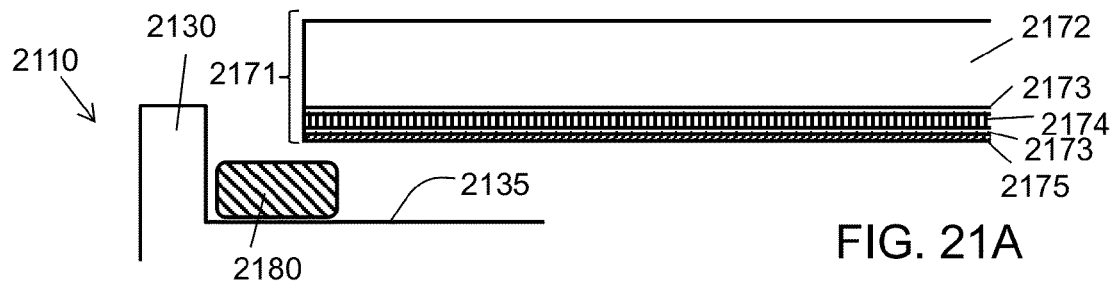
FIGS. 21A and 21B are partial cross-sectional partial schematic views of the installation of a photovoltaic element in a frame structure according to one embodiment of the invention.
Figure 21B:
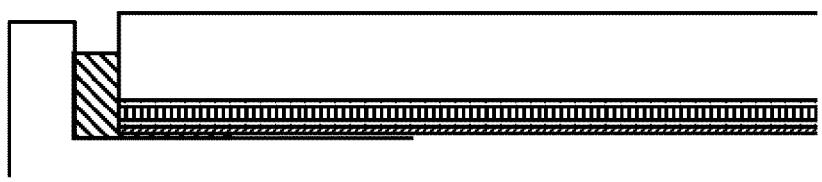
Figure 21C:
FIG. 21C is a partial cross-sectional schematic view of a comparative example.

An example of this effect is shown in partial cross-sectional schematic view in FIGS. 21A and 21B. In FIG. 21A, frame structure 2110 includes a sidewall 2130 at its edge, which extends from the base surface 2135. A bead of adhesive sealant 2180 has been applied inside the sidewall, and a photovoltaic element 2171 is provided ready to be assembled to the frame to produce a photovoltaic roofing element. In this embodiment, the photovoltaic element is in the form of a laminate (i.e., shown as a plurality of layers, including a layer of photovoltaic cells 2174 encapsulated by polymer films 2173 (e.g., EVA films) to a back sheet 2175 and a transparent cover (e.g., glass) 2172). In FIG. 21B, the photovoltaic element has been disposed on the frame inside the sidewall. The bead of adhesive is squeezed to flow, filling the space between the frame surface and the laminate, making contact with both so as to bond the laminate to the frame. In FIG. 21B, the flow of the adhesive around the corner edge of the photovoltaic element proceeds up its side edge, but is contained in its flow by the sidewall of the frame structure. This can be contrasted with the situation shown in FIG. 21C; in the absence of sidewalls, the adhesive can flow laterally away from the photovoltaic element, and insufficiently seal in the edge of the photovoltaic element. As shown in FIG. 21C, without a sidewall, the edge interfaces of the photovoltaic laminate structure can remain unencapsulated, thus leaving them susceptible to moisture intrusion and possible detrimental effects on performance of the module over time when exposed to weather and the environment.

In certain embodiments, the height of one or more of the sidewalls is such that, when the photovoltaic element is installed, it is somewhat lower (i.e., in the plane of the photovoltaic element) than the top surface of the photovoltaic element in at least some portions. This is illustrated in FIG. 21B, in which the sidewall is slightly lower than the top surface of the sidewall, such that water can drain down the roof from the top surface of the photovoltaic element. For example, in certain embodiments, the sidewall at the bottom edge of the frame structure is lower than the top surface of the photovoltaic element. In other embodiments, the sidewalls at the bottom edge and one or more of the side edges are lower than the top surface of the photovoltaic element. For example, in certain such embodiments, the sidewalls are lower than the top surface of the photovoltaic element by an amount in the range of about 0.1 mm to about 5 mm, or in the range of about 0.25 mm to about 2 mm.

In certain embodiments, the base surface of the area on which the photovoltaic element is disposed includes one or more raised structures, on which the photovoltaic element rests. Thus, in such embodiments, there remains a fixed space between the downward-facing surface of the photovoltaic element and the upward-facing surface of the base of the frame, such that an adhesive layer of a controlled thickness can be formed.

Figure 22:
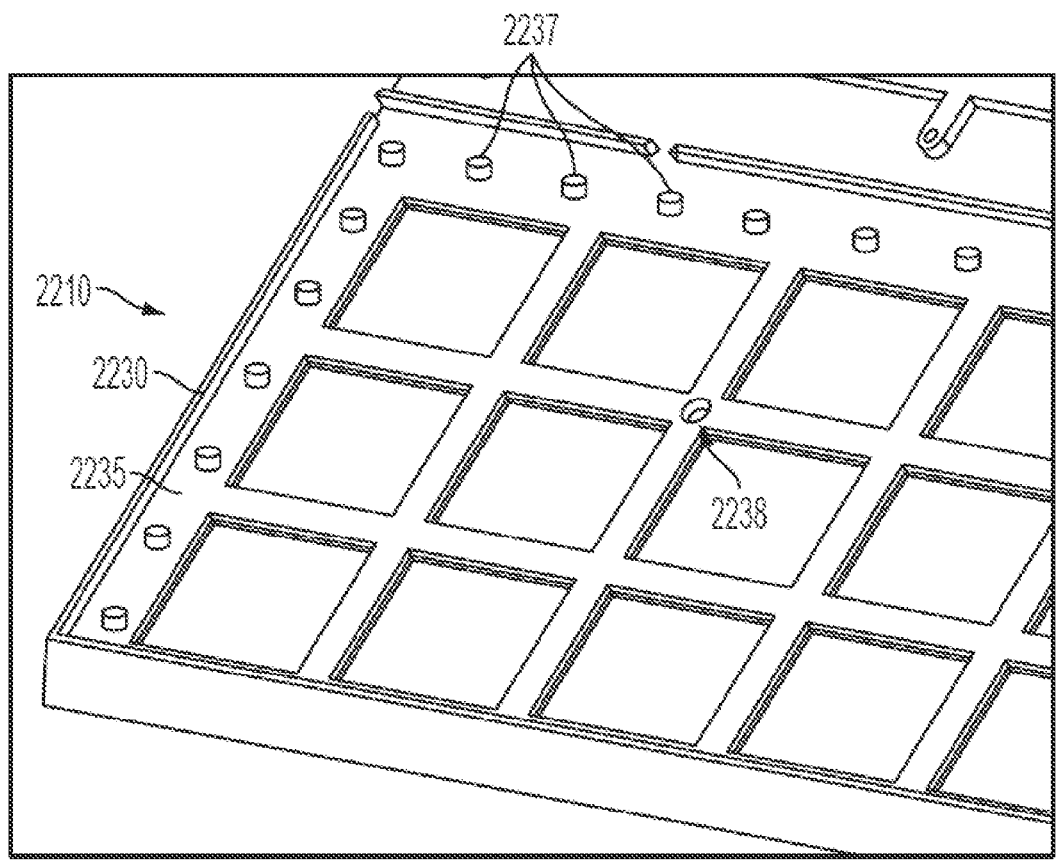
FIG. 22 is a perspective schematic view of a frame structure suitable for use in certain embodiments of the invention.

An example of such a frame structure is shown in perspective schematic view in FIG. 22. In the embodiment of FIG. 22, frame structure 2210 includes sidewalls 2230, which enclose the area in which a photovoltaic element is to be disposed, which area includes base surface 2235. Extending upwards from the base surface are raised structures 2237. Desirably, the raised structures are formed on less than about half of the base surface. In this embodiment, the base surface also has a hole or depression 2238 formed therein, through which fasteners can affix the frame structure to a roof surface. The raised structures can position the photovoltaic element at a selected height above the base surface of the frame structure, thereby providing a reproducible thickness or volume of sealant or adhesive beneath the perimeter of the photovoltaic element. It can also allow space for adhesive to flow upward at the edge of the photovoltaic element to help ensure the sealing of the photovoltaic element at the sidewall. In embodiments in which no raised structures are provided (see, e.g., FIG. 21B), care should be taken to ensure that an appropriate amount of adhesive is used uniformly around the frame and that the photovoltaic element is placed with uniform even pressure so that adhesive can bond the photovoltaic element to the frame, sealing the panel, and avoiding uneven squeezing of the adhesive. If the pressure or adhesive amounts are not adequately controlled, some portions of the perimeter may have insufficient sealant, and/or the photovoltaic element may become misaligned in the frame structure during assembly. The use of raised structures can thus simplify the assembly process. Moreover, the raised structures can provide additional support for the photovoltaic media, thus helping to strengthen the photovoltaic roofing element so that it can be walked upon with a reduced risk of damage. The use of raised structures can also help with repeatability of the assembly process, ensuring that all photovoltaic elements protrude substantially the same amount from the frame structure.

Figure 23:
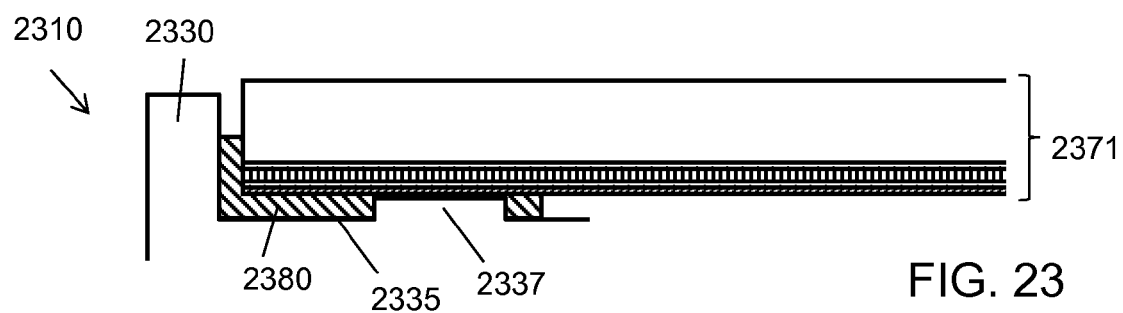
FIG. 23 is a cross-sectional partial schematic view of a photovoltaic roofing element according to one embodiment of the invention.

The use of a raised structure is illustrated in cross-sectional schematic view in FIG. 23. The photovoltaic element 2371 is disposed on the frame structure 2310 inside the sidewall 2330. When the bead of adhesive 2380 is squeezed to flow, the photovoltaic element rests on the raised structures 2337, spaced from the base surface 2335. The adhesive fills the space between the base surface and the photovoltaic element, making contact with both so as to bond the laminate to the frame as described above with reference to FIG. 21B. As noted briefly above, the raised structures provides a gap between the downward-facing surface of the photovoltaic element and the base surface of the frame structure along the perimeter, and the sidewall contains the adhesive and helps its flow direction to seal the edge of the photovoltaic element.

The height of the one or more raised structures can be selected to provide for an appropriate volume of adhesive between the photovoltaic element and the frame structure. In some embodiments, the one or more raised structures are greater than about 10 mils in height, greater than about 20 mils in height, greater than about 30 mils in height, greater than about 40 mils in height, or greater than about 50 mils in height. In one particular embodiment, the height dimension of the raised structure is about 40 mils. In certain embodiments, the one or more raised structures are less than about 200 mils in height, less than about 150 mils in height, or less about than 100 mils in height.

Figure 24:
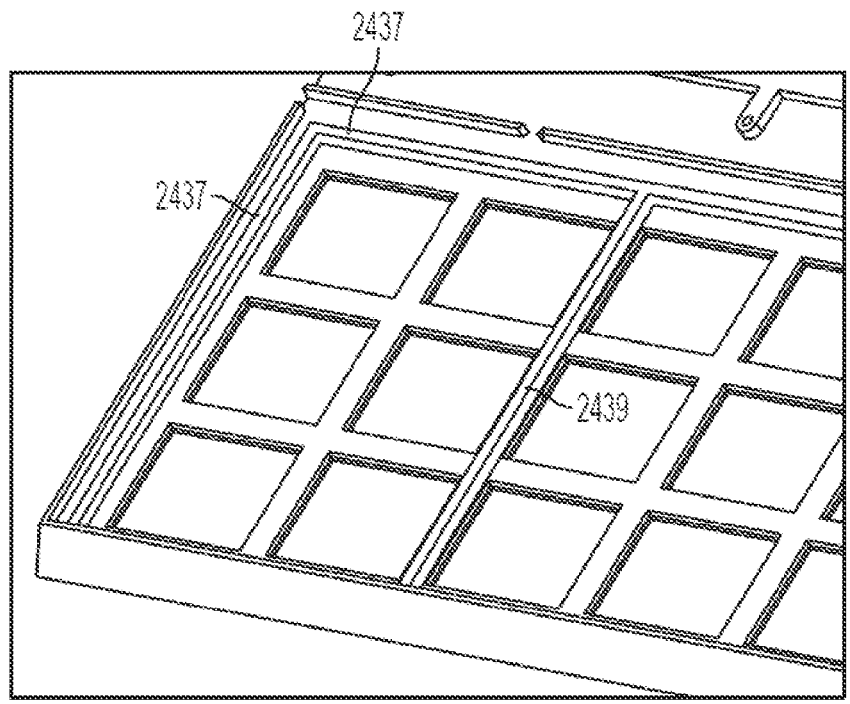
FIG. 24 is perspective schematic view of a frame structure suitable for use in certain embodiments of the invention.

In the embodiment of FIG. 23, the raised structures are formed as a discontinuous series of features (here, pedestals). In other embodiments, the raised structures are formed as one or more continuous (or substantially continuous) ridges. For example, in the embodiment of FIG. 24, a frame structure has raised ridges 2437 along the perimeter of the area in which the photovoltaic element is to be disposed. In this embodiment, additional raised structures (in the form of ridges 2439) are disposed along the interior of the area in which the photovoltaic element is to be disposed (here, along the support ribs) in order to support the photovoltaic element in the event of surface loading. When a photovoltaic element is to be installed, a sealant or adhesive can be applied along the perimeter of the area in which the photovoltaic element is to be disposed, inside the sidewalls and outside the raised structures. The raised structures can thus form a channel or moat into which adhesive can be disposed. As described above, when the photovoltaic element is disposed within the frame, it rests on the raised ridge structures, squeezing a portion of the adhesive or sealant so that it flows upwardly at the edges and is contained by the sidewalls of the frame structure.

Figure 25:
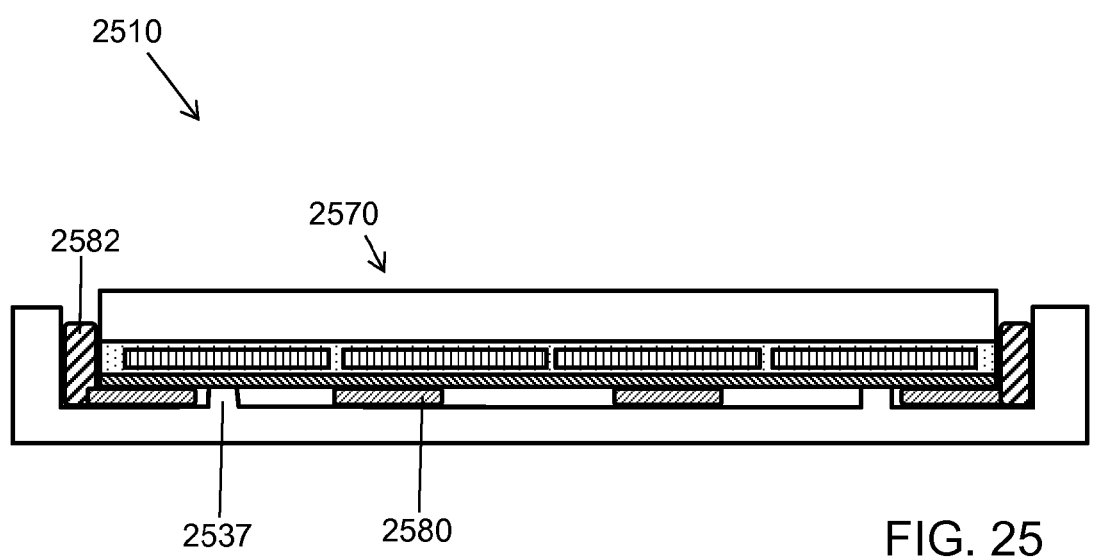
FIG. 25 is a cross-sectional schematic view of a photovoltaic roofing element according to one embodiment of the invention.

FIG. 25 shows a side cross sectional schematic view of an embodiment of a photovoltaic roofing element as assembled. A frame structure 2510 (formed from polymer) holds a photovoltaic element 2570 in laminate form. The laminate structure includes crystalline silicon-based photovoltaic cells encapsulated by an ethylene vinyl acetate (EVA)-based adhesive and protected with a glass cover sheet and a polymeric back sheet, as more generally described above with reference to FIG. 21A. A raised structure 2537 supports the module a set distance from the frame structure. An adhesive 2580 fills the gap in selected areas between the module and the frame. One adhesive that can be utilized is known as adhesive 804 Dow Flexible Adhesive provided by the Dow Chemical Company of Midland, Mich. In certain embodiments of the invention, and as shown in FIG. 25, a second adhesive or caulking material 2582 is included for sealing the edge of the photovoltaic laminate assembly in the frame. The second material 2582 may be different from or the same as the first adhesive. In particular, moisture cure or two component cure systems can be useful for sealing the edges of the photovoltaic element.

Figure 26:
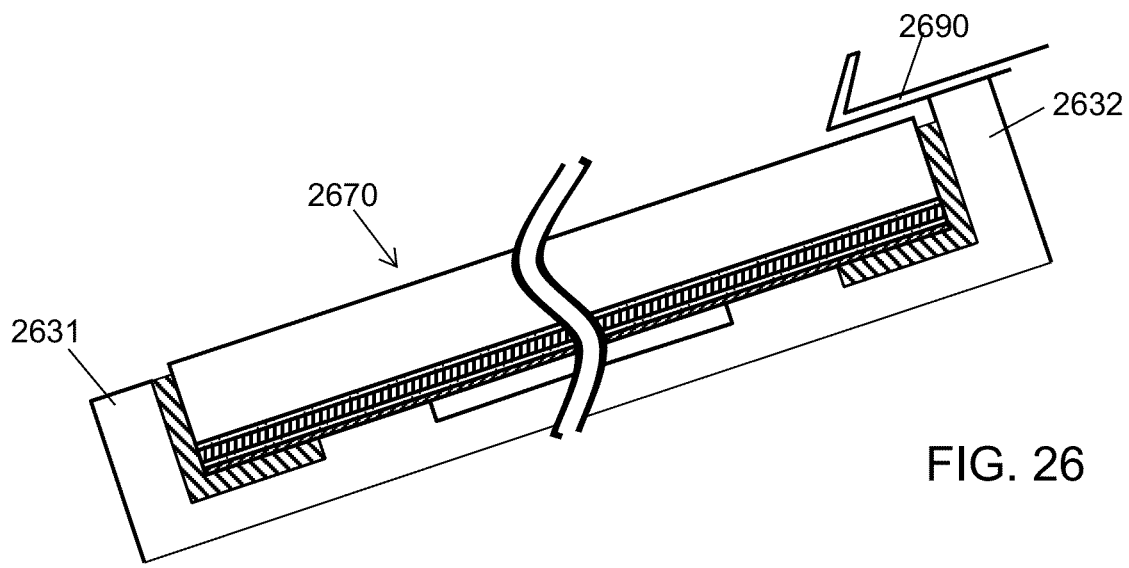
FIG. 26 is perspective schematic view of a frame structure suitable for use in certain embodiments of the invention.

As noted above, in certain embodiments, the height of one or more of the sidewalls is such that, when the photovoltaic element is installed, it is somewhat lower than the top surface of the photovoltaic element in at least some portions. In certain such embodiments, the sidewall adjacent the top edge of the frame structure has a height such that, when the photovoltaic element is installed, it is somewhat higher (i.e., in the plane of the photovoltaic element) than the top surface of the photovoltaic element, at least in some portions. Such an embodiment is shown in cross-sectional schematic view (i.e., looking across the roof surface) in FIG. 26. In FIG. 26, bottom edge sidewall 2631 is lower than the upward-facing surface of the photovoltaic element 2670; while the top edge sidewall 2632 is higher than the upward-facing surface of the photovoltaic element 2670. Notably, a wind clip 2690 sits on the top edge sidewall 2632, and does not contact the top surface of the photovoltaic element, thus minimizing damage to the photovoltaic element (e.g., via scratching resulting from movement of the wind clip relative to the photovoltaic element due to wind).

Figure 27:
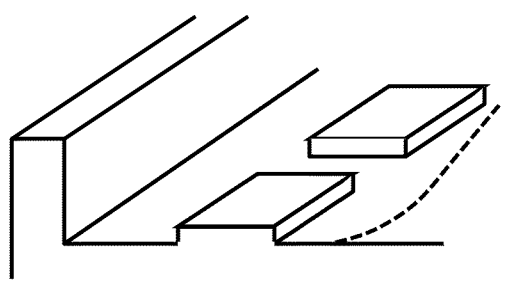
FIG. 27 is a perspective/cross-sectional schematic view of a frame structure suitable for use in certain embodiments of the invention.

As noted above, in certain embodiments of the invention, the raised structures are discontinuous. Accordingly, in use, adhesive is not confined within a "moat" formed by the raised structure, and can flow through the discontinuities to adhere the photovoltaic element to the frame structure in more internal areas. FIG. 27 is a cross-sectional/perspective partial schematic view of a frame structure having a discontinuous raised structure. When a photovoltaic element is installed into this frame structure with an adhesive as described above, the adhesive flows not only up the sidewall, but also through the discontinuity to occupy additional space between the frame and the laminate, internal relative to the raised structures. The dashed line shows an example of the extent of adhesive flow. Accordingly, a discontinuous set of raised structures can provide greater surface area of bonding between the photovoltaic element and the frame structure.

Figure 28A:
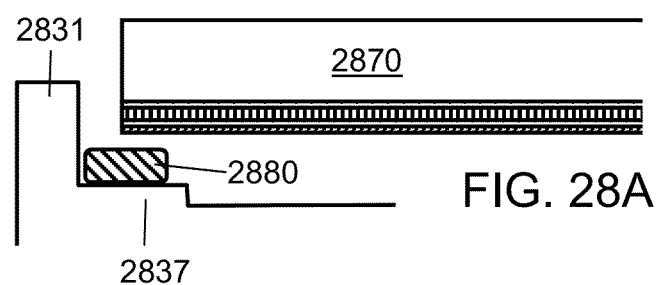
FIGS. 28A and 28B are partial cross-sectional partial schematic views of the installation of a photovoltaic element in a frame structure according to one embodiment of the invention.
Figure 28B:
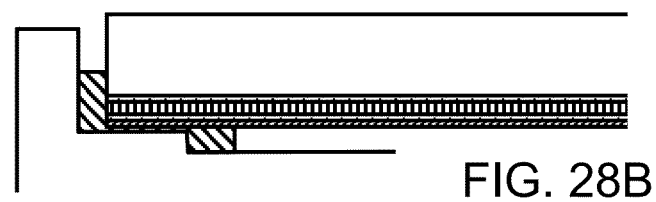

In certain embodiments, a raised structure is positioned in contact with a sidewall. One such embodiment is shown in partial cross-sectional schematic view in FIGS. 28A and 28B. In FIG. 28A, a bead of adhesive 2880 is applied on the raised structure 2837, which is disposed in contact with the sidewall 2831. Photovoltaic element 2870 is positioned over the frame structure, ready to be pushed down onto the adhesive. In FIG. 28B, the photovoltaic element has been pushed onto the raised structure, and the adhesive flows into the space between the edge of the photovoltaic element and the sidewall and the area inside the raised structure to bond the parts to one another.

Figure 29A:
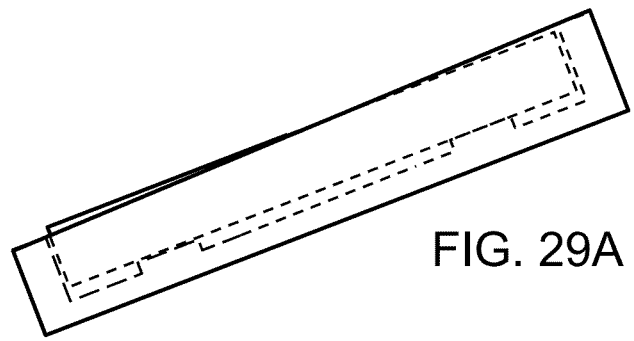
FIGS. 29A, 29B and 29C are edge partial schematic views of photovoltaic roofing elements according to certain embodiments of the invention.
Figure 29B:
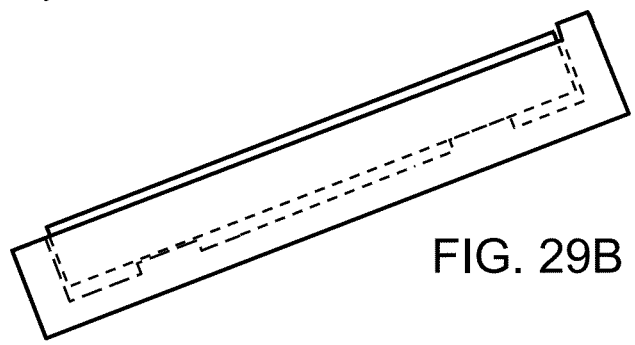
Figure 29C:
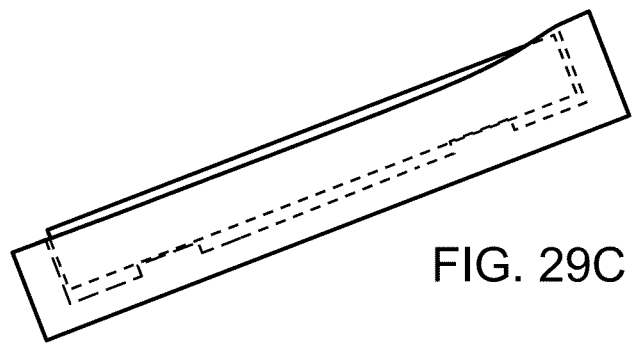

FIGS. 29A, 29B and 29C are partial schematic end views (with cross-sectional detail in dashed line) of photovoltaic roofing elements according to various embodiments of the invention. The bottom end of each is on the left of each figure; and the top end is on the right. Attachment zones are not shown in these figures. In all of FIGS. 29A, 29B and 29C, the bottom edge sidewall is slightly lower than the top surface of the photovoltaic element (i.e., in the plane of the photovoltaic element). In FIG. 29A, the right edge sidewall (i.e., disposed to the front) tapers from top edge to bottom edge so that at least portions of the edge sidewall are lower than the top surface of the photovoltaic element when installed in the frame structure. Having the bottom and edge sidewalls lower than the top surface of the photovoltaic element allows for drainage of water off of the photovoltaic roofing element in use. In FIG. 29B, the right edge sidewall is the same height as the bottom edge sidewall with a distinct transition in height near the top end of the part of the frame structure containing the photovoltaic element. In FIG. 29C, there is a smooth transition in right edge sidewall height near its top end.

Figure 30:
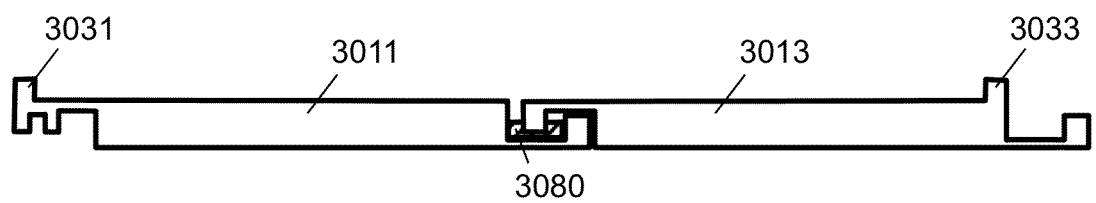
FIG. 30 is a cross-sectional schematic view of a frame structure constructed from two pieces according to one embodiment of the invention.

In certain embodiments, the frame structure is formed from a plurality of horizontally-adjacent pieces. The frame structure can, for example, be assembled from separate pieces on the roof, with the separate pieces on the roof together providing the sidewalls forming a substantially closed polygon. Such a frame structure can be assembled with a single photovoltaic element covering both pieces of the frame structure. The pieces can be joined with an expansion joint in their area of overlap, the expansion joint designed to offset differences in thermal expansion between the frame structure and the photovoltaic element (e.g., especially when the photovoltaic element is formed with a glass protective sheet). The expansion joint can be formed, for example, by shiplap features that have play in them, such that the two horizontally adjacent pieces can move somewhat with respect to one another. An example is shown in cross-sectional schematic view in FIG. 30. Frame pieces 3011 and 3013 interlock to form a single frame structure that is configured to hold a photovoltaic element within sidewalls 3031 and 3033. The shiplap features do not fit tightly, but rather leave some room for the pieces to shift horizontally. In the embodiment of FIG. 30, a flexible sealant 3080 seals the pieces to one another while allowing them to move with respect to one another to accommodate expansion or contraction differences due to temperature.

Figure 31:
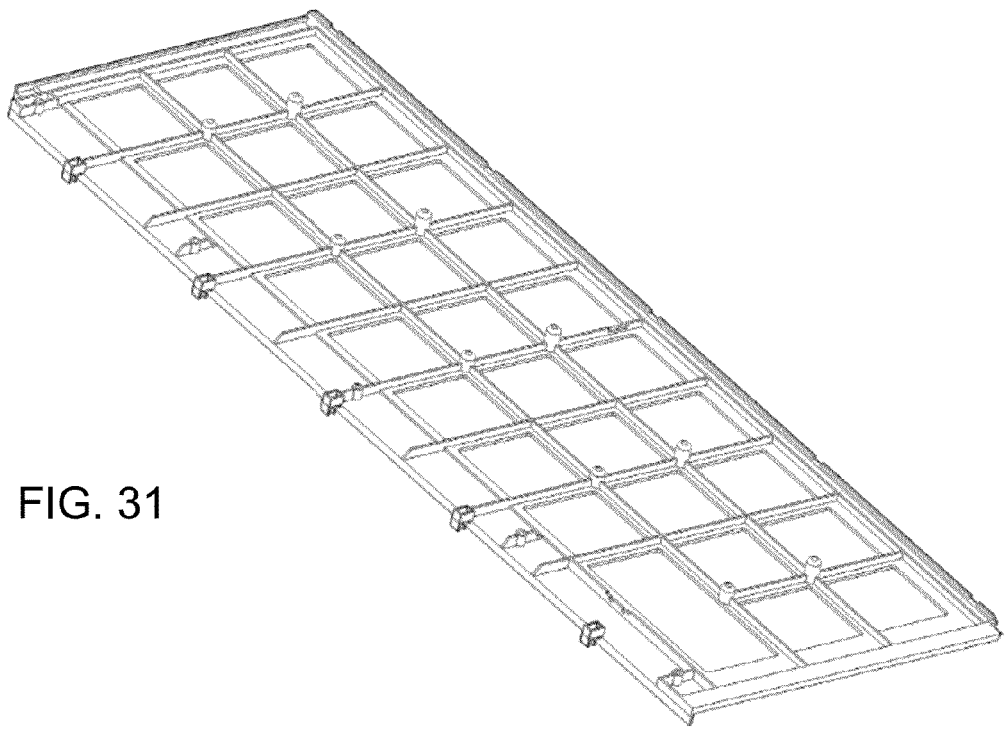
FIG. 31 is a bottom view of an example of a photovoltaic roofing element according to one embodiment of the invention.

FIG. 31 is a bottom perspective view of a frame structure for a photovoltaic roofing element. Distributed across the underside of the frame are support legs (in a "bullnose" shape in this embodiment) to bring the frame structure into contact with the roof deck as photovoltaic roofing elements are laid in an overlapping fashion in an array. The legs closer to the bottom edge of the photovoltaic roofing array are taller than the legs closer to the top edge. The bottom edge does not have the legs, as it is intended to rest atop the fastening zone of a photovoltaic roofing element in the next lowermost course or a cant strip or starter strip. The legs maintain a space beneath the structure to aid in wire management. While this frame structure as depicted does not include wind clips and a ledge as otherwise described herein, the person of ordinary skill in the art will appreciate that wind clips and a ledge can be included in such a structure. Moreover, as the person of ordinary skill in the art will appreciate, the photovoltaic roofing element need not have contact points with the roof deck when installed. In other embodiments, a photovoltaic roofing element can span the distance between the attachment point and then place where it rests on the underlying photovoltaic roofing element.

Another aspect of the invention is a photovoltaic roofing system comprising a first course of horizontally-arranged photovoltaic roofing elements and a second course of horizontally-arranged photovoltaic roofing elements overlying the first course, each photovoltaic roofing element comprising:
  a frame structure having a top end and a bottom end, and an upward-facing surface and a downward-facing surface, the frame structure having an attachment zone and an exposure zone, with the exposure zone disposed toward the bottom end of the frame structure, and the attachment zone disposed toward the top end of the frame structure, the frame structure further including a ledge extending away from the top end of the frame structure and one or more wind clips extending from the downward-facing surface of the frame structure in the exposure zone; and one or more photovoltaic elements held in the exposure zone of the frame structure, wherein the second course overlies the first course such that the exposure zones of the photovoltaic roofing elements of the first course are substantially exposed and the attachment zones of the photovoltaic roofing elements of the first course are substantially overlaid, and the one or more wind clips of each photovoltaic roofing elements of the second course engage the ledge of one or more of the photovoltaic roofing elements of the first course.

Another aspect of the invention is a photovoltaic roofing system comprising a first course of horizontally-arranged photovoltaic roofing elements and a second course of horizontally-arranged photovoltaic roofing elements overlying the first course, each photovoltaic roofing element comprising:

a frame structure having a top end and a bottom end, and an upward-facing surface and a downward-facing surface, the frame structure having an attachment zone and an exposure zone, with the exposure zone disposed toward the bottom end of the frame structure, and the attachment zone disposed toward the top end of the frame structure, the frame structure further comprising an L-shaped ridge extending laterally on its upward-facing surface in the attachment zone, the L-shaped ridge comprising a feature extending substantially vertically from the upward-facing surface and a feature extending from the upward end of the vertically-extending feature substantially horizontally toward the bottom end of the frame structure, the frame structure further comprising one or more wind clips formed on the underside of the frame structure at its bottom end, each wind clip comprising a feature extending substantially horizontally toward the top end of the frame structure; and one or more photovoltaic elements held in the exposure zone of the frame structure, wherein the second course overlies the first course such that the exposure zones of the photovoltaic roofing elements of the first course are substantially exposed and the attachment zones of the photovoltaic roofing elements of the first course are substantially overlaid, and the one or more wind clips of each photovoltaic roofing elements of the second course engage the L-shaped ridge ledge of one or more of the photovoltaic roofing elements of the first course, such that the horizontal feature of each wind clip of the a photovoltaic roofing element of the second course is disposed under the horizontally-extending feature of the L-shaped ridge of a photovoltaic roofing element of the first course.

In each of these aspects, the wind clips of the photovoltaic roofing elements of the second course can engage the corresponding features of the photovoltaic roofing elements of the first course (i.e., the L-shaped ridge or the ledge) as otherwise described herein. The person of skill in the art will appreciate that the systems can include a third course overlying the second, a fourth course overlying the third, etc., with wind clips of overlying courses engaging with features of the underlying courses as described herein.

Another aspect of the invention is a photovoltaic roofing system disposed on a roof deck having an top end and a bottom end, the photovoltaic roofing system comprising: one or more photovoltaic roofing elements as described herein; a plurality of roofing elements disposed adjacent the contiguously-disposed photovoltaic roofing elements, along their side edges; and side flashing elements disposed along the side edges of the contiguously-disposed photovoltaic roofing elements, the side flashing elements having a cross-sectional shape comprising a vertically-extending feature and a flange extending away from a lateral side at the downward end of the vertically-extending feature, with the flange facing away from the contiguously-disposed photovoltaic roofing elements and being at least partially disposed between a roofing element and the roof deck, the vertically-extending feature including a matched interlocking geometry adapted to interlock with the sidelap portion of an adjacent photovoltaic roofing element.

FIG. 32 shows a partial assembly of a small array of the photovoltaic roofing elements. The array of FIG. 32 is three (two regular length plus one short length) photovoltaic roofing elements wide and two photovoltaic roofing elements high. It includes starter strips. Side and top flashing (not shown) can be provided as described in U.S. Provisional Patent Application Ser. No. 61/429,053 (and as described in more detail below), to close the array at the sides and top and merge the photovoltaic array into a field of surrounding conventional shingles. As the person of ordinary skill in the art will recognize, it may be desirable to use conventional roofing media at the edges of the photovoltaic roofing systems described herein, for example to fully cover oddly-shaped areas of a roof deck, or to provide full coverage at the edges of a roof deck, for example, at a hip, ridge, valley or eave.

Certain aspects of the invention relate to the fashion in which flashing elements are provided to close the transition that merges a photovoltaic array made up of photovoltaic roofing elements into the field of conventional roofing products used in conjunction with the photovoltaic roofing elements. Flashing elements as installed together with a small array of photovoltaic roofing elements (frame structures shown) are shown in perspective view in FIG. 32.

Accordingly, one aspect of the invention is a photovoltaic roofing system disposed on a roof deck having a top end (i.e., toward the ridge of the roof) and a bottom end (i.e., toward the eave of the roof). The photovoltaic roofing system includes one or more photovoltaic roofing elements contiguously disposed on the roof deck, the contiguously-disposed roofing elements together having a top edge facing the top end of the roof deck, a bottom edge facing the bottom end of the roof deck, and two side edges. Each photovoltaic roofing element comprises one or more photovoltaic elements disposed on a frame structure. The frame structure includes sidelap portions having geometries adapted to interlock with adjacent photovoltaic roofing elements to provide water drainage channels. The photovoltaic roofing system also includes a plurality of roofing elements disposed adjacent the contiguously-disposed photovoltaic roofing elements, along their side edges. The photovoltaic roofing system further comprises side flashing elements disposed along the side edges of the contiguously-disposed photovoltaic roofing elements, the side flashing elements having a cross-sectional shape comprising a vertically-extending feature and a flange extending away from a lateral side at the downward end of the vertically-extending feature, with the flange facing away from the contiguously-disposed photovoltaic roofing elements and being at least partially disposed between a roofing element and the roof deck. The vertically-extending feature includes a matched interlocking geometry adapted to interlock with the sidelap portion of an adjacent photovoltaic roofing element. For example, in certain embodiments, the vertically-extending features of the side flashing elements along a first lateral edge of the contiguously-disposed photovoltaic roofing elements include a downward-facing flange, disposed in upward-facing channels of the photovoltaic roofing elements disposed along the first lateral edge; and wherein the vertically-extending features of the side flashing elements along a second lateral edge of the contiguously-disposed photovoltaic roofing elements include an upward-facing water drainage channel, into which downward-facing flanges of the photovoltaic roofing elements disposed along the second lateral edge are disposed.

Preferably a top flashing and/or a bottom flashing are also included to merge the photovoltaic roofing system with a field of conventional roofing products and close the transition areas therebetween to the elements. Accordingly, in certain embodiments, one or more top flashing elements is or are disposed along the top edge of the contiguously-disposed photovoltaic roofing elements, the one or more top flashing elements having a bottom end disposed over the top edge of the contiguously-disposed photovoltaic roofing elements; and a top end disposed under one or more roofing elements disposed along the top edge of the contiguously-disposed photovoltaic roofing elements.

Figure 35:
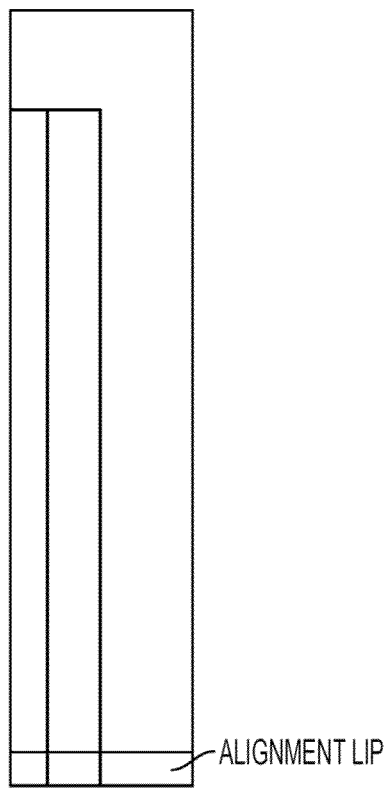

FIGS. 33, 34 and 35 show top schematic views and edge schematic views of examples of top flashing elements for closing the top portion of the array of photovoltaic roofing elements according to one embodiment of the invention. In these figures, the top plan views depict the leftmost side of a given flashing section near the top of the drawing and the rightmost side near the bottom of the drawing. In FIG. 33, the lineal or standard piece for flashing the array, but not at an edge of the array, has hidden lap alignment features. At the left end of the flashing element, a portion is thinned for a distance on the bottom of the piece, dashed lines indicating the thinning on the bottom. At the right end, the thinning is at the top. When adjacent flashing elements are installed across the array, the left end overlaps the right end of an adjacent section of flashing. The thinning of the end provides an indicator for proper lateral overlap at the end. From left to right in FIG. 33, the flashing has three zones. The two left zones go up and over the upper edge of the topmost course of the photovoltaic roofing panels in the array. The right portion is flat on the roof deck. Conventional roofing materials are installed so that they overlap at least the right uppermost portion of the top flashing to direct moisture down the roof. In some instances, the exposure zone of a conventional roofing product may extend to cover the majority, or completely cover, the top flashing elements across the photovoltaic roofing product array. FIG. 34 shows views of a right end top flashing element. The upper flat flange in the plane of the roof deck extends around to the right end beyond the raised bend feature. FIG. 35 shows views of a left end top flashing element, the flashing flange extending around to the left. The raised bend feature covers the top edge of the photovoltaic roofing array. The flanges underlie adjacent conventional roofing materials. The flashings can be formed from a variety of materials; for example, they can be molded or formed from plastic or metal.

Figure 36:
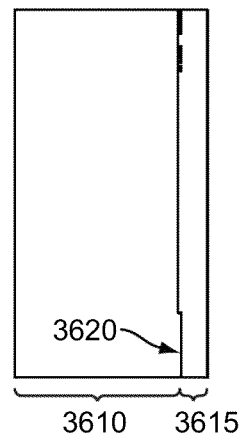
FIG. 36 is a set of schematic views of side flashing pieces suitable for use in certain embodiments of the invention.
Figure 36:
Figure 36:
Figure 36:

FIG. 36 is a set of schematic views (top, back, side and front) of a right side flashing element for use with photovoltaic roofing elements of FIGS. 1, 1A and 2 according to one embodiment of the invention. The right side flashing element is installed along the right edge of a set of contiguously-disposed photovoltaic roofing elements. It includes an overlap portion 3610 and an exposed portion 3615. The top schematic view of FIG. 36 has the uppermost portion of the right flashing at the lower end of the figure. A cut-back notch 3620 is provided so that an overlying right side flashing element can fit into the underlying piece with a flush right edge. The side schematic view in FIG. 36 shows that the right side flashing element has a greater height at its lower end (left side of the side schematic view) than at its upper end, to accommodate the canting of the photovoltaic roofing elements in the course as they overlie the underlying course. The front view (i.e., looking up the roof) and the back view (i.e., looking down the roof) show downward directed ridges that interact cooperatively with the underlying drainage channel at the right side edge of the roofing panel of FIG. 1. The downward directed structures are analogous to the structures shown at the left edge of the photovoltaic roofing element of FIG. 1. The right side flashing element engages with the right side edge of the roofing panel in a shiplap fashion, with the flange (i.e., overlap portion 3010) extending under adjacent conventional roofing material to flash in and close the roof to the elements. In some embodiments, the flange extends at least about 2 inches, at least about 4 inches, at least about 6 inches, or at least about 8 inches or more under the adjacent roofing materials. It will be understood that for use with photovoltaic roofing elements of another dimension, the size and proportion of the right side flashing elements may be suitably adapted.

Figure 37:
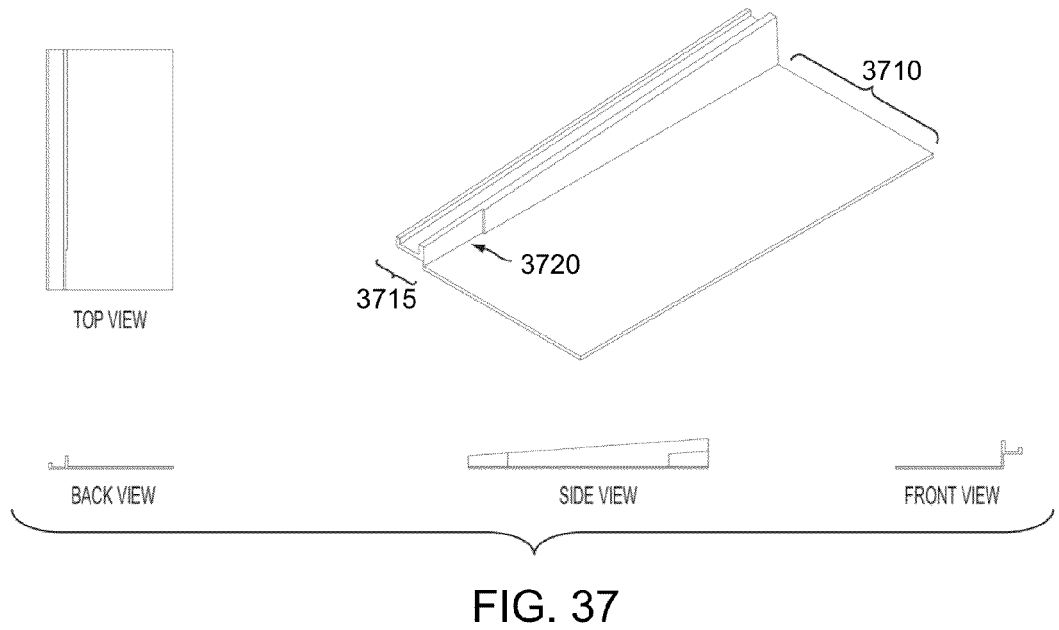
FIG. 37 is a set of schematic views of opposing side flashing pieces suitable for use in certain embodiments of the invention.

FIG. 37 is a set of schematic views (top, back, side, front and perspective) of a left side flashing element for use with photovoltaic roofing elements of FIGS. 1, 1A and 2 according to one embodiment of the invention. The left side flashing element is installed along the left edge of a set of contiguously-disposed photovoltaic roofing elements. It includes an overlap portion 3710 and an exposed portion 3715. The top view of FIG. 37 has the uppermost portion of the left side flashing element at the lower end of the figure. A cut-back notch 3720 is provided so that an overlying left side flashing element can fit into the underlying piece with a flush left edge. The side view in FIG. 37 shows that the left side flashing element has a greater height at its lower edge (at the right side of the figure) than at its upper end to accommodate the canting of the photovoltaic roofing elements in the course as they overlie the underlying course. The front view of the left side flashing element is taken looking up the roof and the back view is taken looking down the roof. The front view (i.e., looking up the roof) and the back view (i.e., looking down the roof) show the upward-directed edge ridge and drainage channel that interact cooperatively with the overlying downward-directed ridges at the left side edge of the photovoltaic roofing element of FIGS. 1, 1A and 2. The upward directed ridge and drainage channel are analogous to the structures shown at the right edge of the photovoltaic roofing element of FIG. 1. Preferably, the left side edge flashing is installed prior to installation of a leftmost photovoltaic roofing element in a course. The left side edge flashing element engages with the left side edge of the photovoltaic roofing element in a shiplap fashion and provides a flange (i.e., the overlap portion 3710) to extend under adjacent conventional roofing material to flash in and close the roof to the elements. In some embodiments, the flange extends at least about 2 inches, at least about 4 inches, at least about 6 inches, or at least about 8 inches or more under the adjacent roofing materials. It will be understood that for use with photovoltaic roofing elements of another dimension, the size and proportion of the left side flashing elements may be suitably adapted. It will also be understood that if geometries of parts of the roofing system including photovoltaic roofing elements and flashing components are reversed, such as for example by mirroring, that preferred orders of installation may also accommodate such changes.

As noted above, FIG. 32 is a top perspective schematic view of a partial assembly of photovoltaic roofing elements and flashing components. The photovoltaic roofing elements are similar to those of FIGS. 1, 1A and 2, the photovoltaic elements being shown as semitransparent. In the frame structures, the exposure area is underlain by slats (here, crisscrossing), spaced to support the photovoltaic elements, but allowing wiring to run from the downward-facing side of the photovoltaic elements to the downward-facing surface of the photovoltaic roofing element, thereby protecting it from weather. In this embodiment, the slat structure also includes a square pad for the attachment of larger electrical components, for example, a junction box for wiring together individual photovoltaic elements and providing a single electrical output for the overall photovoltaic roofing element. In the array of photovoltaic roofing elements of FIG. 32, the individual photovoltaic roofing elements are laterally offset from one another; this offset configuration provides a visual effect similar to some conventional roofing materials. Shorter framing structures are included to fill in the offset so that the array has common linear left and right edges. These fill pieces may include photovoltaic elements (not shown), or may include another upper surfacing media (not shown) with a complementary visual appearance to the photovoltaic roofing elements and/or associated conventional roofing elements to be installed therearound. Left side flashing elements are included in the assembly of FIG. 32, applied in an overlapping fashion and cooperatively engaged with the left edge of the photovoltaic roofing elements as described above. A cant strip is provided to raise the lower leading edge of the bottommost course of photovoltaic roofing elements as described above. Right side flashing elements are included to cooperatively engage the right side edges of the photovoltaic roofing elements as described above. It will be noted that fastening locations for the side flashing elements are such that a lower fastening location of each unit is suggested and that an upper fastening point is accomplished by successive fastening of the next overlying course flashing element. Top flashing elements are also included in the assembly of FIG. 32. The top right end flashing element includes the flange to the right to underlie adjacent conventional roofing elements, and includes raised bend portions to step up and onto the contiguously-disposed photovoltaic roofing elements at the edge thereof. In this instance, the right top end flashing element overlaps the center top flashing element with a hidden alignment overlap. In this instance, the top flashing elements are depicted with fastening slots. With slots it may be desirable to fasten the pieces to the roof in a non-hardnailing manner so that larger pieces may move laterally to accommodate thermal expansion and contraction. It will be understood that in certain instances, an alignment undercut or thinning may be omitted, in which case, it may be desirable for the flashing elements to float freely analogously to conventional vinyl siding to accommodate thermal expansion and contraction in use. It will be also understood that in a wider array including a greater number of photovoltaic roofing elements, a larger number of top center flashing elements may be employed. A left top end flashing element is not shown in FIG. 32, but the person of skill in the art would understand that a full assembly can include one. Moreover, while FIG. 32 does not explicitly show wind clips engaging with ledges and/or L-shaped features as described herein, the person of ordinary skill in the art will appreciate that a system according to various aspects of the invention would include such features.

The person of ordinary skill in the art will appreciate that it can be desirable to use a cant strip at the down-roof end of an array of photovoltaic roofing elements, in order to put the down-roof most course of photovoltaic roofing elements into the same angular orientation as the rest of the courses, and to close the lower edge of the array. Cant strips are generally described in U.S. Provisional Patent Application Nos. 61/429,053, 61/528,631 and 61/559,614, and U.S. Patent Application Publications nos. 2012/0210660, 2012/0186630 and 2013/0125482. FIG. 32 shows a cant strip as described in the referenced publications; the person of skill in the art will appreciate that a starter strip as described herein may be used at the bottom end of the array.

Figure 38:
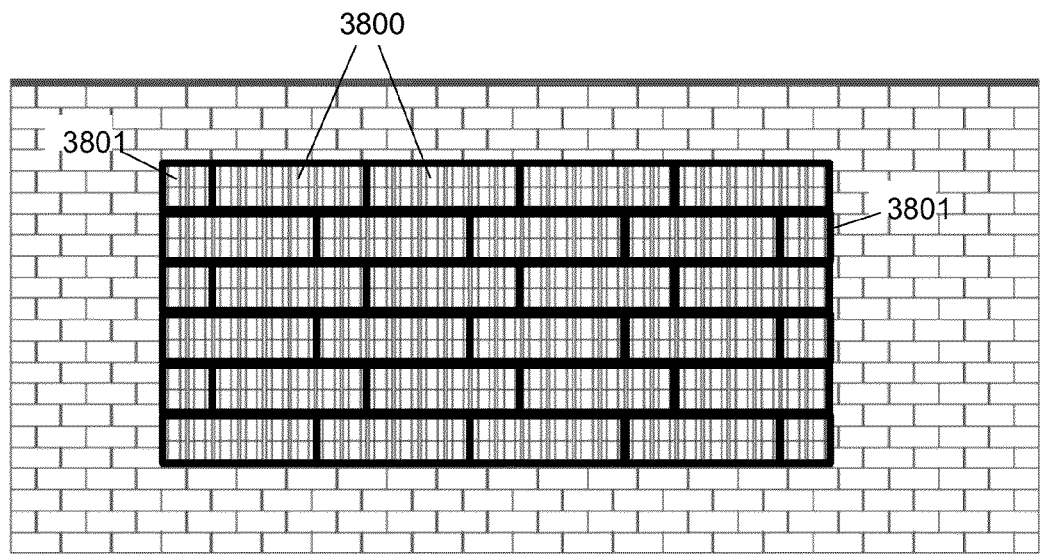
FIGS. 38 and 39 are schematic plan views of photovoltaic roofing systems according to certain embodiment of the invention.

FIG. 38 is a schematic top view of a photovoltaic roofing system, in which a rectangular array of contiguously-disposed photovoltaic roofing elements as described above is installed on a roof with conventional metric three-tab shingle of 13¼"×39⅜" dimension and 5⅝" exposure. Each photovoltaic roofing element 3800 includes 2 rows of 6 six-inch square photovoltaic elements. The photovoltaic roofing elements are offset by using shorter photovoltaic roofing elements 3801 at alternate ends of the courses, each shorter photovoltaic roofing element having 2 rows of 2 photovoltaic elements. In some embodiments an offset is preferred so that continuous alignment of a large number of drainage channels in the shiplap portion of the photovoltaic roofing elements does not occur vertically up the array. The offset of the photovoltaic roofing elements enables a lateral offset of the drainage channels at the right side edge in the ship lap portion of the photovoltaic roofing element so that drainage can occur over the face of underlying courses of photovoltaic roofing elements. In this way, in heavier rain situations, overloading of aligned drainage channels is avoided. The shorter fill panels include all of the edge features of the larger photovoltaic roofing elements. Sections of cant strip (not shown) are included along the lower edge of the array. Left side edge flashing (not shown) is provided along the left edge of each course of photovoltaic roofing elements in the array. Right side edge flashing (not shown) is provided at the right edge of each course of photovoltaic roofing elements. Top flashing (not shown) with molded edge flashing for the ends of the array is included across the top of the array and covered by overlying shingles.

Figure 39:
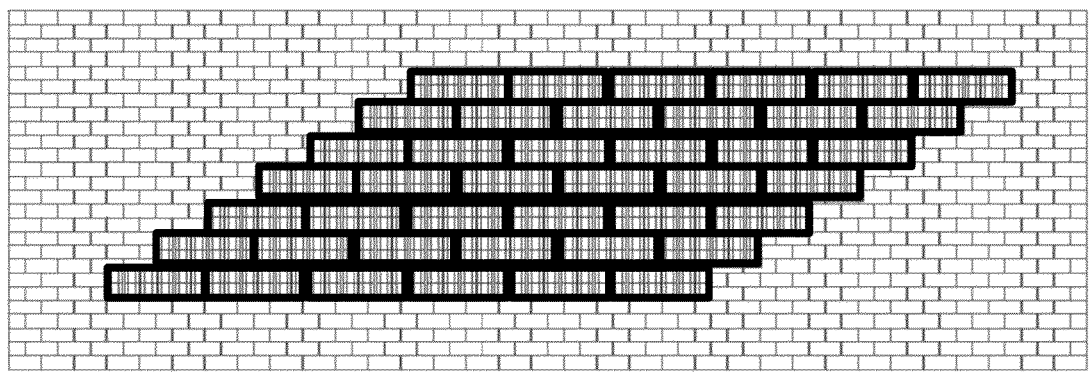

FIG. 39 shows a diagonally stepped array of photovoltaic roofing elements on a roof of three-tab shingles. The offset provides the drainage features as noted above. In this array, the left end of each course includes a left side flashing unit and a short piece of left end top flashing unit to flash in the diagonal step up the array and close the roof for drainage. Right side edge flashing and cant strips are provided at the right end of each course.

Of course, the person of ordinary skill in the art will understand that the arrangements of FIGS. 38 and 39 are merely exemplary, and that the photovoltaic roofing systems described herein can be arranged in a variety of different manners. For example, in certain embodiments, the overall shape of the array of photovoltaic roofing elements can be trapezoidal or triangular, for example, to fit roofing decks of different shapes. Photovoltaic roofing elements can be installed in a racked configuration, as would be apparent to the person of ordinary skill in the art.

Figure 40:
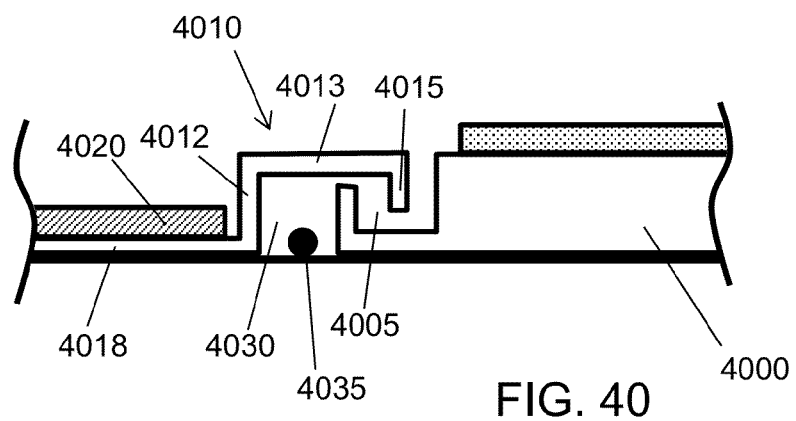
FIG. 40 is a schematic cross-sectional view of interlocking photovoltaic roofing elements according to one embodiment of the invention.

FIG. 40 depicts an alternative side flashing configuration, in which one or more side flashing elements is configured such that a conduit is formed underneath the side flashing element and adjacent the frame structure of the photovoltaic roofing element with which it interlocks. Frame structure 4000 includes an upward-facing water drainage channel 4005. Side flashing 4010 includes a vertically-extending feature 4012 which has a downward-facing flange 4015, which fits into upward-facing water drainage channel 4005. Side flashing also includes a flange 4018 extending away from the frame structure, on which a roofing element (here, a shingle 4020) is disposed. Notably, the vertically-extending feature also extends horizontally (shown by ref no. 4013) sufficiently to form a conduit 4030 adjacent the frame structure. Wiring 4035 is shown disposed in the conduit. Accordingly, the flashing can act as a conduit to track the wiring up or down a side of an array to a convenient location for wire take off from the roof or, in certain instances, a convenient location for a roof penetration.

Figure 41:
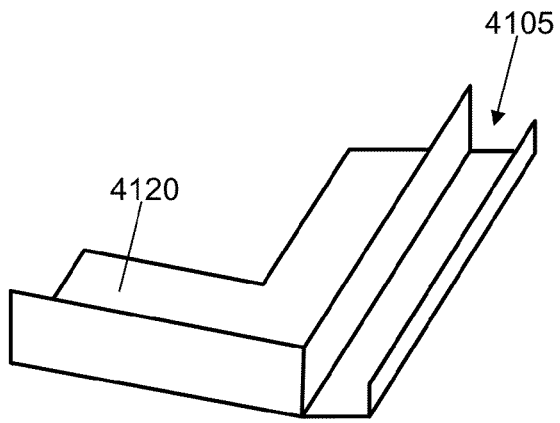
FIG. 41 is a schematic perspective view of a stepped side flashing piece according to one embodiment of the invention.

FIG. 41 is a perspective view of an alternative side corner flashing for use in a stepped diagonal array with an offset in the photovoltaic roofing elements (e.g., as shown in FIG. 39). In this case the water drainage channel 4105 directs moisture downward on the roof over an underlying course of shingles and a horizontal flange 4120 extends further over an attachment zone of a panel of the underlying course so that it may be flashed in with conventional roofing products.

Figure 42:
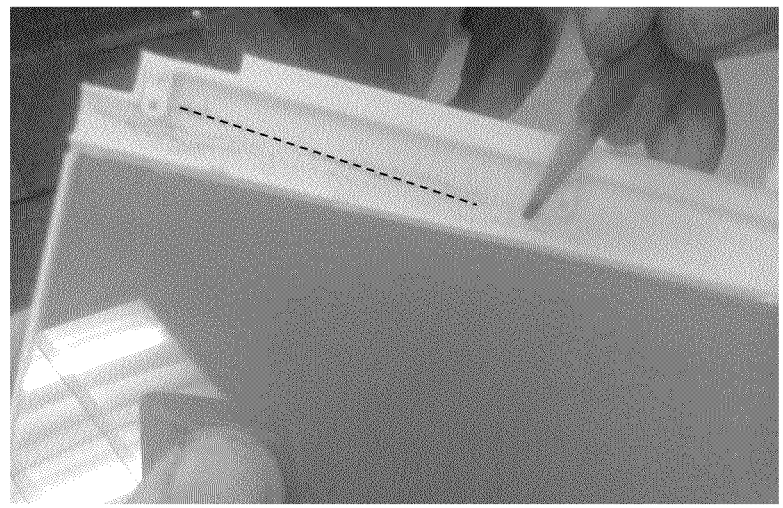
FIG. 42 is a pair of partial schematic views of a photovoltaic roofing element according to one embodiment of the invention.
Figure 42:
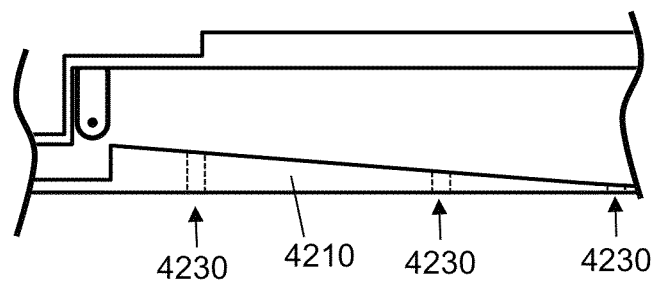

In some embodiments, as shown in FIG. 42 in partial schematic view, one or more diagonal ridges are disposed in the attachment zone. The ridge(s) are disposed such that, when the photovoltaic roofing element is installed, they are sloped toward the bottom end thereof, such that water entering the attachment zone may traverse down to a drainage hole or channel and then out over the top surface of the exposure area, and then down the roof. In FIG. 42, ridge 4210 is disposed at a diagonal with respect to the horizontal axis of framing structure. Drains or weep holes 4230 may also be provided periodically along the length of a diagonal water dam in the attachment zone as depicted in FIG. 42.

Figure 43:
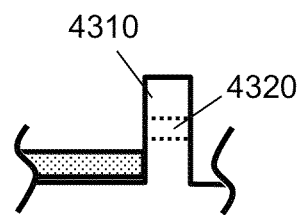
FIGS. 43-45 are schematic cross-sectional views of ridge structures suitable for use in certain embodiments of the invention.
Figure 44:
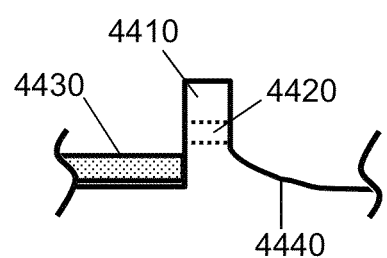
Figure 45:
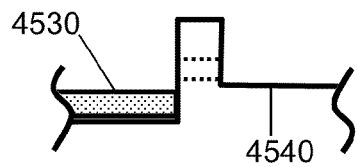

FIG. 43 is a schematic cross-sectional view of a ridge 4310 with a drain channel 4320 in phantom. The ridge is one configuration for a first dam in an attachment zone above the exposure zone of a roofing element. Any water intrusion into the attachment zone can be directed downward and out through the drain opening or to the edge of the photovoltaic roofing element and down the water drainage channel at the side. FIG. 44 is a cross-sectional view of another configuration, in which a photovoltaic element 4430 is present in the exposure area on the downward side of the ridge 4410 (left in the figure). The top planar surface of the photovoltaic element is above the plane of the attachment area higher up the roofing panel. In the drain slot 4420 through the ridge of FIG. 44, the base of the slot (shown in phantom) is at or slightly above the same plane as the top surface of the photovoltaic element, such that water flows across the photovoltaic element, instead of underneath it. The surface 4440 of the attachment zone is tapered upwards, such that water is delivered to the drain slot. One benefit of the ramp structure is that water would be delivered over the surface of the photovoltaic module and away from sealed joint between the photovoltaic element and the frame structure. FIG. 45 is a schematic cross-sectional view of another modification of the drainage system, with the base plane 4540 of the attachment zone at a level even with or above the plane of the photovoltaic element 4530 so that water is delivered from the attachment zone over the photovoltaic element below without the need for a ramp or taper. The ridge structures of FIGS. 43, 44 and 45 can be used, for example, as a ridge at the bottom end of the attachment zone as described above with respect to FIG. 1.

Figure 46:
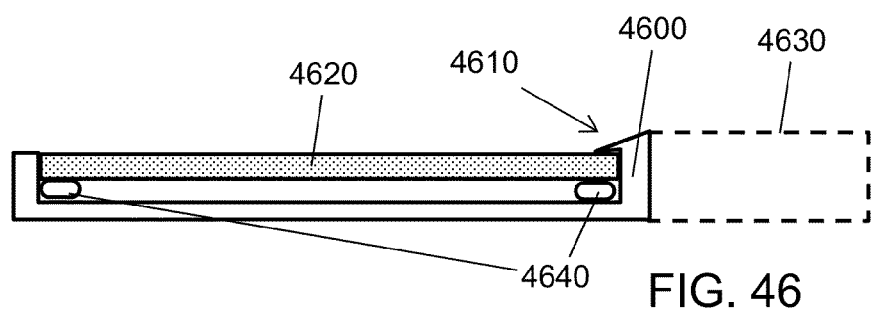
FIGS. 46 and 47 are partial schematic views of photovoltaic roofing elements according to certain embodiments of the invention.

FIG. 46 is a cross-sectional view of a portion of a frame structure equipped with a photovoltaic element. The frame structure 4600 includes, at the top end of the exposure zone, a receiver flange 4610 which secures the upper edge of the photovoltaic element 4620. The attachment zone is shown in phantom by reference numeral 4630. Sealant 4640 is depicted around the perimeter of the photovoltaic element to seal the photovoltaic element to the frame structure.

Figure 47:
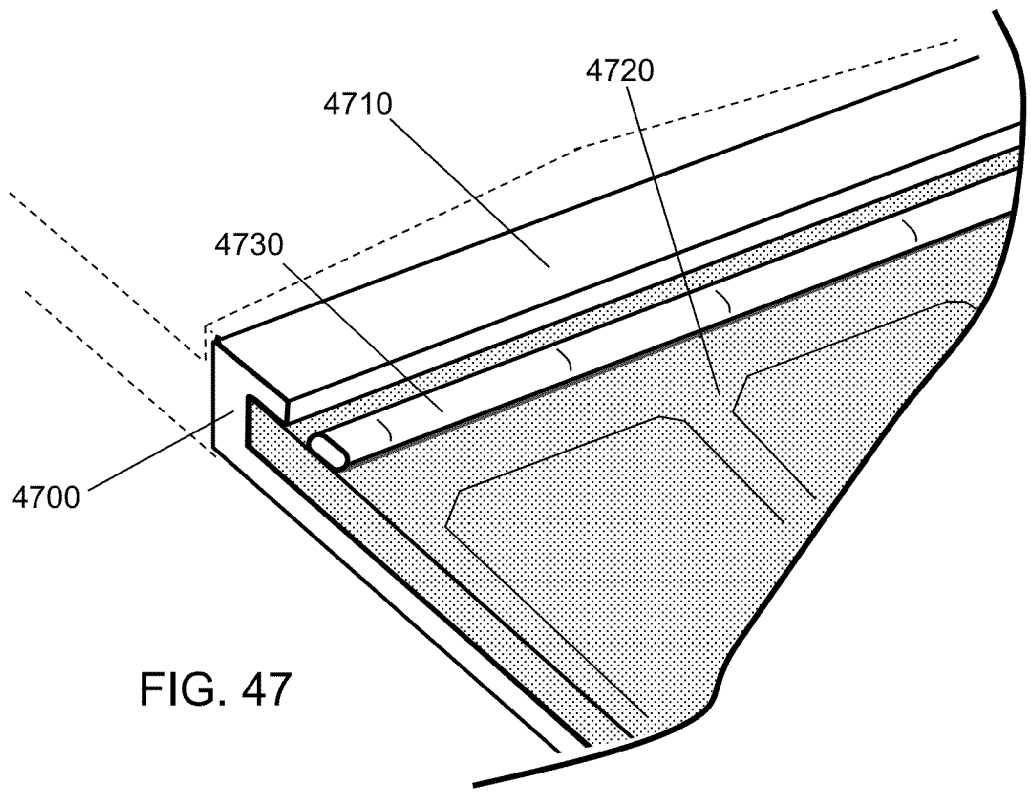

In FIG. 47, another embodiment of a frame structure equipped with a photovoltaic element is shown in partial perspective view. A receiver flange 4710 is provided at the top edge of the frame structure 4700 as described with respect to FIG. 46. In the embodiment of FIG. 47, a dam strip 4730 is disposed on the upward-facing surface of the photovoltaic element 4720, above the top of the active area of the photovoltaic element. The dam strip is raised from the surface of the photovoltaic element, and can cooperate with a recess on the underside of the leading edge of an overlying photovoltaic roofing element to aid in closure of the system to moisture. The dam strip can be applied to the surface of the photovoltaic element after it is installed. In one embodiment, the dam strip is installed with a gentle angle, with one end of the dam strip closer to the top end of the photovoltaic roofing element than the other, in order to guide any moisture that would intrude over the dam to the water drainage channel at the side edge of the roofing panel. Optionally, the dam strip may comprise a sealant to close the system to water.

In certain embodiments, the frame structure is rigid. Suitable materials for the framing structure include polycarbonate, polyphenylene ether resins and blends and other polymers. Filled polyolefins such as polypropylenes and copolymers or polyvinyl chloride, CPVC, ASA or AES can be used for the various flashing components. Parts can be made by extrusion followed by forming such as sizing or vacuum forming, depending on the polymer and its flow properties, or by molding processes such as injection molding or compression molding. Filled polymers and composites with low thermal expansion coefficients are preferred. Of course, other materials can be used to make the various frame structure and flashing components, including other plastic materials and metals.

While the present disclosure particularly describes photovoltaic roofing elements in tile form (e.g., that would integrate with conventional concrete tiles), the person of ordinary skill in the art will appreciate that other form factors could be used. For example, lower profile frame structures can be used to integrate with asphalt shingles. While frame structures are shown as having parallel upward and downward surfaces, the person of skill in the art will appreciate that they can be formed with a taper (i.e., tapering toward the bottom end of the frame).

A photovoltaic roofing system has been described that can integrate photovoltaic roofing elements with conventional roofing products. The system can provide edge, top and bottom closure for the roof against the elements. Lateral interlocks and drainage channels can contribute to the closure of the roof Ridges and grooves can provide tortuous pathways to inhibit moisture transgression into the roof. Raised nail bosses or fastening points can provide another level of difficulty for moisture entry through the roof. Aspects that are useful for the prevention of entry of wind driven rain can also be useful for electrical considerations in maintaining electrical components in a dry environment.

The canted or extended leading edge of the photovoltaic roofing elements described herein can provide for easy downward flow of moisture on the roof. If moisture intrusion occurs in the attachment zone, a ridge structure with weep holes for drainage can inhibit further intrusion of the moisture. A ridge near the top edge of the attachment zone can prevent overflow of the attachment zone and helps direct moisture to drainage channels. In some cases the downward-facing surface of the leading edge of the photovoltaic roofing element includes recesses that can receive the ridges and further assist in directing moisture down the roof.

In preferred photovoltaic roofing systems the parts are available in modular components that fit together and can be kitted in advance to minimize the need for fabrication on site. For example, flashing components and starter strips and/or cant strips, in this instance, are provided in lengths that are integral multiples of the dimensions of the photovoltaic roofing elements or partial photovoltaic roofing element sizes to accommodate predetermined arrays for the roofing system in dimensions and power ratings suitable for a particular roofing project. Accordingly, assembly on the roof can be simplified.

Any cabling or wiring interconnecting the photovoltaic roofing elements of the invention in a photovoltaic roofing system can, for example, be long and flexible enough to account for natural movement of a roof deck, for example due to heat, moisture and/or natural expansion/contraction. The cabling or wiring can be provided as part of a photovoltaic roofing element, or alternatively as separate components that are interconnected with the photovoltaic roofing elements (e.g., through electrical connectors) during installation.

Examples of electrical connectors that can be suitable for use or adapted for use in practicing various embodiments of the invention are available from Kyocera, Tyco Electronics, Berwyn, Pa. (trade name Solarlok) and Multi-Contact USA of Santa Rosa, Calif. (trade name Solarline). U.S. Pat. Nos. 7,445,508 and 7,387,537, U.S. Patent Application Publications nos. 2008/0271774, 2009/0126782, 2009/0133740, 2009/0194143 and 2010/0146878, each of which is hereby incorporated herein by reference in its entirety, disclose electrical connectors for use with photovoltaic roofing products. Of course, other suitable electrical connectors can be used. Electrical connectors desirably meet UNDERWRITERS LABORATORIES and NATIONAL ELECTRICAL CODE standards.

In certain embodiments, the photovoltaic roofing elements of the array are electrically interconnected. The interconnected photovoltaic array can be interconnected with one or more inverters to allow photovoltaically-generated electrical power to be used on-site, stored in a battery, or introduced to an electrical grid. For example, a single inverter can be used to collect the photovoltaically-generated power and prepare it for further use. In other embodiments, the photovoltaic roofing elements can be interconnected with a plurality of micro-inverters disposed on the roof. For example, a single micro-inverter can be used for each photovoltaic roofing element; or a single micro-inverter can be used for a group of photovoltaic roofing elements.

As described above, the photovoltaic roofing elements described herein can include wiring containment structures along their top ends. Alternatively or additionally, other wiring containment structures can be included. The person of skill in the art can determine the length and position of the wiring containment structure, depending, for example, on the particular wiring scheme used for the overall photovoltaic roofing system envisioned. In one embodiment, shown in cross-sectional view in FIG. 48, a frame structure 4800 includes a plurality of downward-facing support structures 4810. The frame structure also includes a wiring containment structure, here a channel 4820, on the downward-facing surface of the frame structure. Accordingly, the wiring 4830 can be held in place such that it cannot be inadvertently pinched underneath the support structures.

Figure 48:
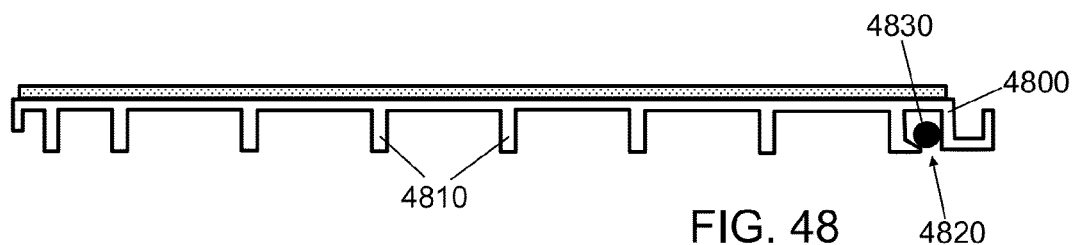
FIGS. 48-50 are schematic cross-sectional views of photovoltaic roofing elements according to certain embodiments of the invention.

In the embodiment of FIG. 48, the wiring containment structure is formed as a channel. In certain embodiments, and as shown in FIG. 48, the edges of the opening of the channel can be somewhat more narrow than the rest of the channel (and of the wiring to be contained therein), such that the wiring can "snap" in. In other embodiments, wiring can be held in the channel in other ways, for example using an adhesive, or using post-applied retaining elements such as fasteners.

Figure 49:
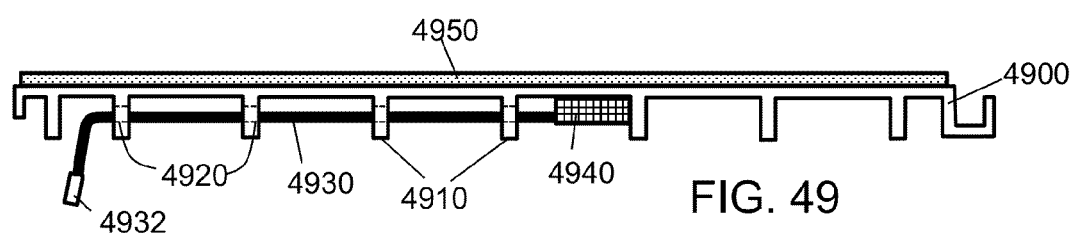

One embodiment of a framing structure is shown in cross-sectional view in FIG. 49. The frame structure 4900 includes downward-facing support structures 4910 (in this embodiment, ribs are formed in a criss-cross pattern, as described above). At least some of the downward-facing support structures can substantially contact the roof when installed. The frame structure also includes a wiring containment structure 4920 that creates a path for wiring 4930 to run along the downward-facing surface of the frame structure, without being caught between the downward-facing support structures and the roof deck. In this embodiment, the wiring containment structure is a series of holes or notches (shown in phantom) cut in the downward-facing support structures; wiring can traverse the downward-facing surface of the through the holes or notches. The wiring containment structure can, for example, run from the junction box to the top end of the frame structure, then to the corner of the frame structure for attachment to an adjacent photovoltaic element.

The frame structure of FIG. 49 is shown equipped with a photovoltaic element 4950 to form a photovoltaic roofing element. The photovoltaic element includes a junction box 4940. The junction box can be used to contain interconnections of various photovoltaic cells of the photovoltaic element, and to provide a single output for the electrical power of the photovoltaic element. Wiring can emerge from or plug into the junction box, and run from there through the wiring containment structure. As shown in FIG. 49, the wiring runs through the wiring containment structure, and is terminated with a connector 4932.

Figure 50:
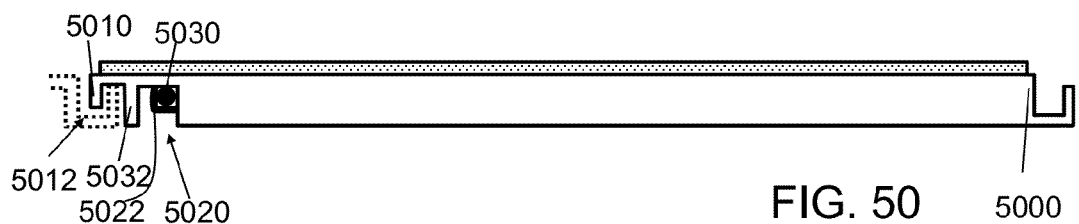
Figure 51:
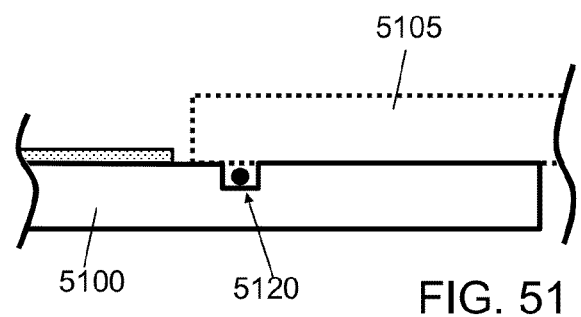
FIGS. 51 and 52 are partial schematic cross-sectional views of frame structures according to certain embodiments of the invention.

In certain embodiments, the wiring is run adjacent to a physical feature that provides a physical interlock between adjacent photovoltaic roofing elements, such as the shiplap interlocking features described above or a tongue-in-groove feature. In such embodiments, a wire containment feature can hold the wire in place such that it cannot inadvertently be caught or pinched in the physical interlock. For example, FIG. 50 shows a cross-sectional view of a corner of a frame structure 5000, in which the outer flange 5010 is designed to fit into a corresponding channel in an adjacent photovoltaic roofing element (shown in dotted line and marked with reference number 5012). The wiring containment structure 5020 (here, a channel) is formed in the downward-facing surface of the frame structure, adjacent the flange 5010 but acting to keep wiring 5030 away from flange 5010. Fastener 5022 holds the wiring in place. In this embodiment, the channel is formed between a downward-protruding wall 5032 and the rest of the frame structure 5010. The channel can be continuous, or can be formed as a series of discontinuous sections. Of course, other shapes can be used for the wiring containment structure; in one embodiment, the structure is tube shaped (e.g., as one or more sections of conduit). While the wiring containment structure in the embodiment of FIG. 50 is shown as running vertically along the frame structure (i.e., in a top end-to-bottom end fashion), the person of skill in the art will appreciate that the wiring containment structure can run horizontally, diagonally, or in a combination of directions, depending on the particular wiring scheme envisioned.

Figure 52:
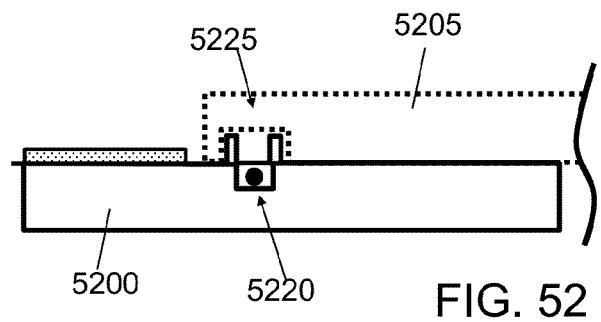
Figure 53:
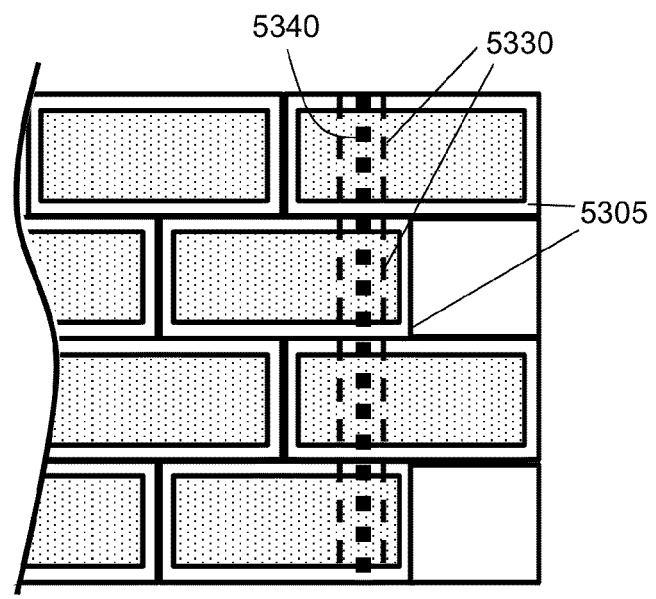
FIG. 53 is a cross-sectional plan view of photovoltaic roofing elements according to one embodiment of the invention disposed in an array.
Figure 54A:
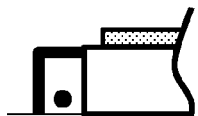
FIGS. 54A-54J are a set of partial cross-sectional views of frame structures according to a variety of embodiments of the invention.
Figure 54B:
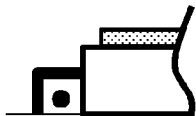
Figure 54C:
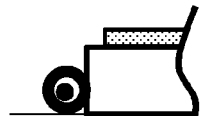
Figure 54D:
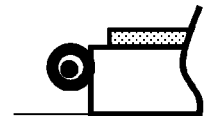
Figure 54E:
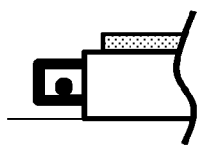
Figure 54F:
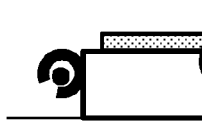
Figure 54G:
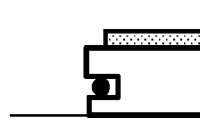
Figure 54H:
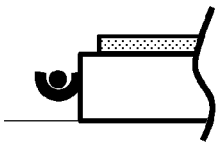
Figure 54I:
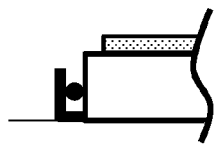
Figure 54J:
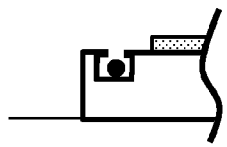

In the embodiments described above, the wiring containment structures are formed on the downward-facing surface of the frame structure, such that the wiring can be run underneath the photovoltaic roofing element. In other embodiments, the wiring is desired to be run along the top surface of the photovoltaic roofing element, for example, in the headlap area, such that it is covered by an overlying photovoltaic element. In other such embodiments, a wiring containment structure can be formed on the upward-facing surface of the frame structure. For example, as shown in partial cross-sectional view in FIG. 51, the wiring containment structure 5120 can be formed as an indentation in the frame structure 5100, such that the wiring runs at or below the plane of the upward-facing surface of the frame structure, and does not protrude such that it interferes with the placement of an overlying photovoltaic roofing element 5105 (shown in phantom). In other embodiments, as shown in FIG. 52, the wiring containment structure 5220 is provided as a raised feature disposed at the upward-facing surface of frame structure 5200, and cooperates with a wiring containment structure 5225 formed on the downward-facing surface of the overlying photovoltaic roofing element 5205 (shown in phantom). In other embodiments, the wiring containment structure is disposed adjacent an edge of the frame structure.

The wiring containment structures as described herein can perform a number of wiring routing functions. For example, as described above, the wiring containment structures can route wiring from the photovoltaic element to the periphery of the photovoltaic roofing element for connection to an adjacent photovoltaic roofing element and/or to a larger electrical system. In other embodiments, the wiring containment structure can allow for other wiring to be run along the photovoltaic roofing element. For example, photovoltaic roofing systems often include "home run" wiring that delivers collected power to a larger electrical system. Wiring containment structures can allow home run wiring to be routed from course to course, as shown in partial schematic plan view in FIG. 53. Wiring containment structures 5330 are formed on the downward-facing surfaces of the frame structures 5305; wiring 5340 runs down the roof in the wiring containment structures 5330. The wiring can be provided within a conduit, such that the conduit fits within the wiring containment structures.

A wide variety of wiring containment structures can be used in practicing various aspects of the present invention. Wiring containment structures can take a variety of shapes. For example, the wiring containment structure can be a series of holes or notches formed in downward-facing support structures, as described above. In other embodiments, the wiring containment structure is formed as a channel. In other embodiments, the wiring containment structure is a conduit. A given wiring containment structure can be formed as a unitary structure; or alternatively in spaced-apart sections (e.g., spaced-apart sections of conduit, or spaced-apart sections of channel). The wiring containment structure can include one or more fasteners, clips, or spots of adhesive to hold the wiring against a surface and away from the downward ends of any downward-facing support structures. In certain embodiments, the wiring containment structure includes a positive interlock that holds the wiring in the wiring containment structure (e.g., edges of a channel that are slightly narrower, so that the wiring can "snap" in). The wiring containment structure can be formed or molded as part of the frame, or can be added after formation of the frame, for example, via adhesive, clip, weld, cleat, rivet, or other mechanical fastener. When holes or other features requiring wiring feed-through are used, the wiring may need to be fed through before any connectors are attached. When the wiring containment structure has an opening (e.g., a channel or a clip), it can be configured to face the roof deck (e.g., to be flush against the roof deck) when installed, thereby holding the wiring in place.

A variety of suitable designs for wiring containment structures are shown in FIGS. 54A-54J.

Figure 55A:
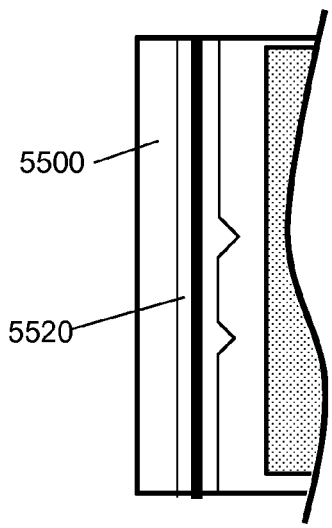
FIG. 55A is a partial schematic top view.
Figure 55B:
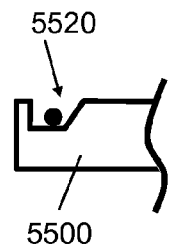
FIG. 55B is a partial schematic cross-sectional view of a frame structure according to one embodiment of the invention.
Figure 56:
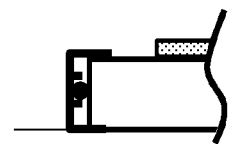
FIG. 56 is a partial cross-sectional view of a frame structure according to one embodiment of the invention.

When a wiring containment structure is a channel formed in an upward-facing surface of a frame structure, it can provide moisture handling as well. Preferably, any wiring or other electrical components disposed in a channel configured for moisture handling is otherwise water-resistant. One embodiment of such a channel is shown in FIG. 55A (schematic top view) and FIG. 55B (schematic cross-sectional view). Channel 5520 is formed in the upward-facing surface of frame structure 5500. The channel structure includes cut-outs that can collect water and admit it into the channel. Such cut-outs can be beveled, with a tapered edge.

In certain embodiments, the wiring containment structure is a separate component, assembled onto the frame structure (for example, during manufacturing or during installation). A schematic cross-sectional view of such a wiring containment structure is shone in FIG. 56. In this embodiment, the wiring containment structure is a separate piece, disposed along the edge of a frame structure.

Figure 57:
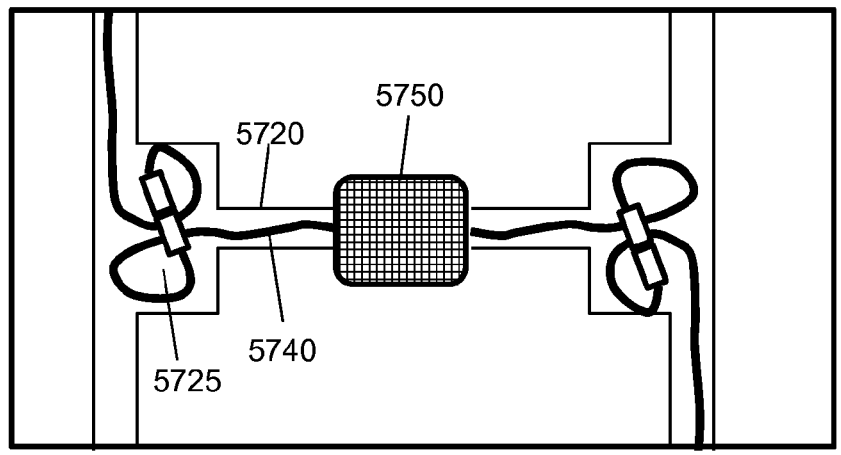
FIG. 57 is a partial plan view of a photovoltaic roofing element according to one embodiment of the invention.

In certain embodiments, the frame structure includes a pocket, formed as a relatively large recess at the upward- or downward-facing surface of the frame structure. The pocket can extend from the surface, defined by features extending therefrom; and/or can be formed as an indentation in the surface. The pocket can be sized to provide a place for the interconnection and protection of connectors. For example, as shown in partial schematic plan view in FIG. 57, wiring 5740 can run through wiring containment structure 5720 from a junction box 5750 to a pocket 5725, where interconnections to adjacent photovoltaic roofing elements can be made. In certain embodiments, the pockets are formed on the downward-facing surface of the frame structure, to allow the interconnection to be protected from the elements. The pockets can be sized to fit the mated connectors and some slack wiring to allow for ease of interconnection. Accordingly, in certain embodiments, mated connectors and/or slack wiring are disposed in the pocket, as shown in FIG. 57.

As the person of ordinary skill in the art will appreciate, the wiring containment structures described herein can in many aspects be adapted for use as a wiring containment structure disposed along the top end of the frame structure as described above.

Another aspect of the invention is a roof comprising a roof deck and a photovoltaic roofing system as described herein disposed on the roof deck. The photovoltaic roofing systems described herein can be utilized with many different building structures, including residential, commercial and industrial building structures.

There can be one or more layers of material (e.g. underlayment), between the roof deck and the photovoltaic modules. The roof can also include one or more standard roofing elements, for example to provide weather protection at the edges of the roof, or in areas not suitable for photovoltaic power generation. In some embodiments, non-photovoltaically-active roofing elements are complementary in appearance or visual aesthetic to the photovoltaic roofing elements. Standard roofing elements can be interleaved at the edges of the photovoltaic arrays described herein. In certain embodiments, the photovoltaic roofing elements are simply disposed on top of an already-installed array of standard roofing elements (e.g., an already-shingled roof).

As described above, a cant strip can be used to cant the first course of photovoltaic roofing elements at an angle similar to the other courses, and to provide wind uplift resistance to the first course. Similarly, in cases where the first course of photovoltaic roofing elements is disposed at the same angle as the other courses (e.g., as a result of the first course of photovoltaic roofing elements overlying a standard roofing element having the same thickness as the photovoltaic roofing elements), a starter strip can be used to provide wind uplift resistance to the first course. Accordingly, the cant strip or the starter strip should have a feature that engages with the wind clips of the first course of the photovoltaic roofing elements.

Thus, another aspect of the invention is a photovoltaic roofing system comprising a first course of horizontally-arranged photovoltaic roofing elements, each photovoltaic roofing element comprising:

a frame structure having a top end and a bottom end, and an upward-facing surface and a downward-facing surface, the frame structure having an attachment zone and an exposure zone, with the exposure zone disposed toward the bottom end of the frame structure, and the attachment zone disposed toward the top end of the frame structure, the frame structure further comprising an L-shaped ridge extending laterally on its upward-facing surface in the attachment zone, the L-shaped ridge comprising a feature extending substantially vertically from the upward-facing surface and a feature extending from the upward end of the vertically-extending feature substantially horizontally toward the bottom end of the frame structure, the frame structure further comprising one or more wind clips formed on the underside of the frame structure at its bottom end, each wind clip comprising a feature extending substantially horizontally toward the top end of the frame structure; or a frame structure having a top end and a bottom end, and an upward-facing surface and a downward-facing surface, the frame structure having an attachment zone and an exposure zone, with the exposure zone disposed toward the bottom end of the frame structure, and the attachment zone disposed toward the top end of the frame structure, the frame structure further including a ledge extending away from the top end of the frame structure and one or more wind clips extending from the downward-facing surface of the frame structure in the exposure zone, the photovoltaic roofing system further comprising a cant strip or a starter strip disposed under the attachment zones of the photovoltaic elements of the first course, the cant strip or the starter strip having a feature that engages the wind clips of the photovoltaic roofing elements. In certain embodiments, the cant strip or the starter strip includes a horizontally-extending feature that is disposed above a horizontally-extending feature of the wind clips (i.e., to mimic the performance of the ledge or the L-shaped ridge). Such a horizontally-extending feature can be shaped like the horizontally-extending feature of the ledge or the L-shaped ridge as described above.

Figure 58:
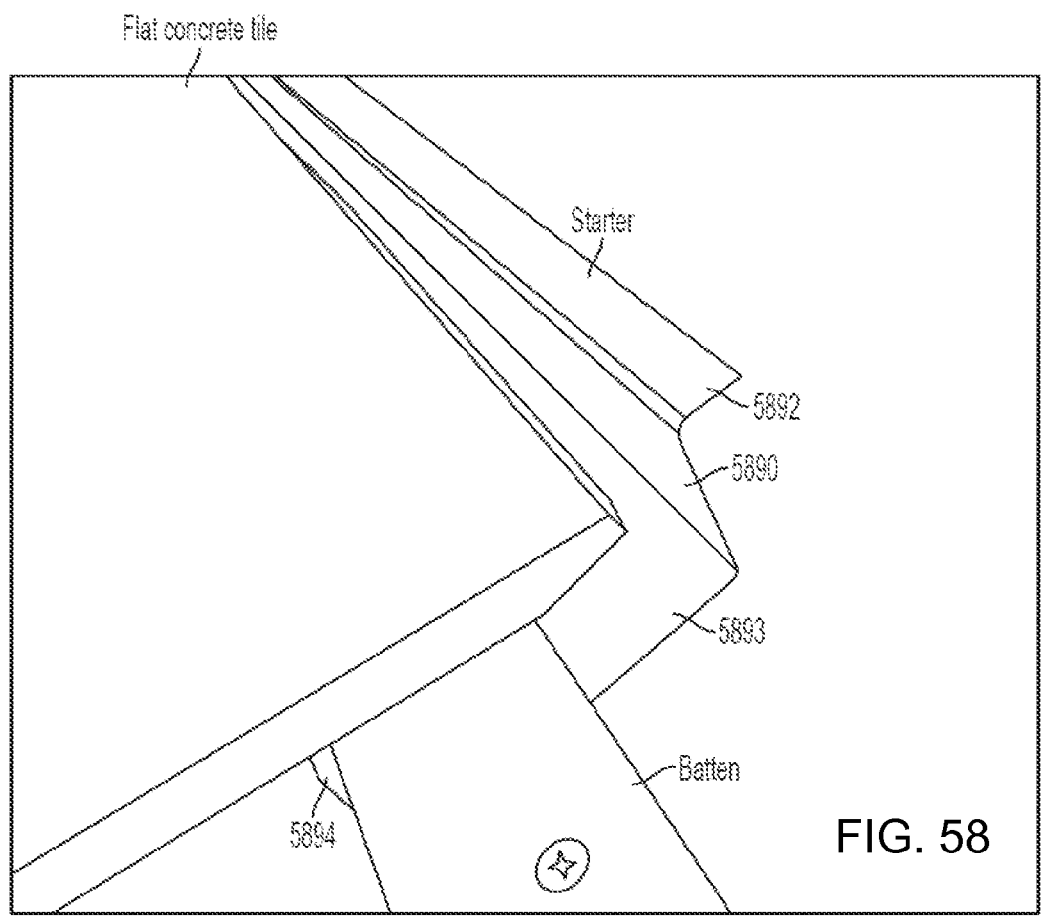
FIG. 58 is a perspective view of a starter strip according to one embodiment of the invention.
Figure 59:
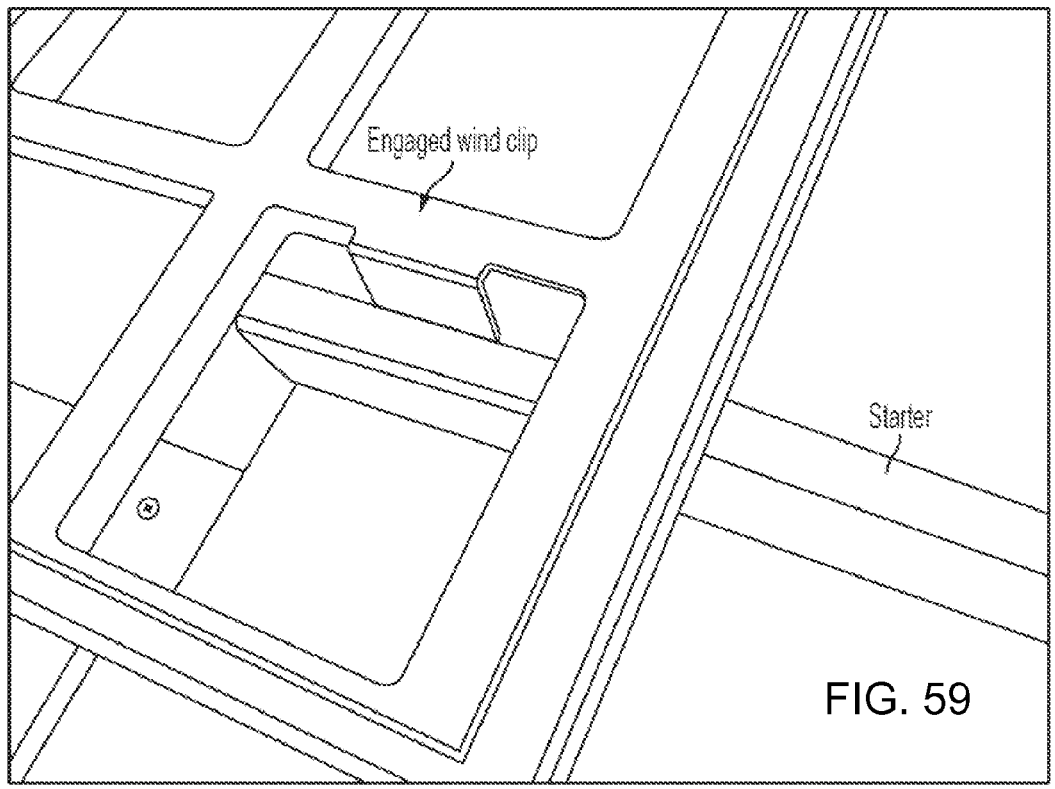
FIG. 59 is a view of a starter strip assembled together with a frame structure according to one embodiment of the invention.

One embodiment of a starter strip is shown in side perspective view in FIG. 58. The starter strip includes a vertically extending feature 5890, and a feature 5892 extending horizontally from the upward end of the vertically extending feature (here, toward the top end of the roof deck). When installed together with a photovoltaic roofing element, the horizontally-extending feature can engage the wind clip as described herein and as shown in FIG. 59. When the photovoltaic roofing element is the type described above that includes an L-shaped ridge, the person of ordinary skill in the art will appreciate that the horizontally-extending feature of the starter strip can extend toward the bottom end of the roof in order to properly engage the wind clips.

In the embodiment shown in FIGS. 58 and 59, the starter strip fits beneath a batten (i.e., which supports an underlying course of concrete tiles), and the batten aligns the starter strip so as to put the horizontally-extending feature in the proper alignment to engage the wind clips of the first course of photovoltaic roofing elements. Here, the starter strip further includes a horizontally-extending base strip 5893 disposed on the roof deck, the vertically-extending feature extending from the top end thereof. At the bottom end of the base strip, a retaining feature 5894 extends vertically in an up-roof direction. When installed, the retaining feature is disposed against the down-roof edge of the batten, thereby positioning the horizontally-extending feature in a position suitable to engage the wind clips of the photovoltaic roofing elements of the first course.

The starter strip can be provided with indication marks and/or pre-formed holes to indicate location and number of fasteners. Such holes can be round in shape, or any other desirable shape (e.g., square, oval, rectangular, diamond-shaped). Holes can be formed to be somewhat larger than the fasteners, which can allow the strip to expand without stress. In certain embodiments, the starter strip and the batten are provided as a preassembled unit, so that an installer can install both in a single operation.

In certain embodiments, a cant strip can be provided instead of a starter strip. The cant strip can include a feature that supports the bottom end of the photovoltaic roofing elements of the first course in order to put them at a desired angular orientation. A cant strip can be used in combination with a separate starter strip, or can include a horizontally-extending feature as described herein with respect to a starter strip.

In certain embodiments, the photovoltaic roofing elements described herein can be installed together with roofing tiles without the use of flashing. For example, in one embodiment, a photovoltaic roofing system is disposed on a roof deck having an top end and a bottom end. The photovoltaic roofing system includes one or more photovoltaic roofing elements as described herein (e.g., arrayed as described herein); a plurality of roofing elements disposed adjacent the contiguously-disposed photovoltaic roofing elements, along their side edges; each roofing element having an edge facing the photovoltaic roofing elements, the edge including a matched interlocking geometry interlocking with the sidelap portion of an adjacent photovoltaic roofing element. For example, in one embodiment, the edge of a roofing element has an upward-facing water drainage channel; and the sidelap portion of the interfacing lateral edge of a photovoltaic roofing element has a downward-facing flange that fits into the water drainage channel of the adjacent roofing element. Similarly, in another embodiment, the sidelap portion of a photovoltaic roofing element has an upward-facing water drainage channel; and the interfacing edge of an adjacent roofing element has a downward-facing flange that fits into the water drainage channel of the adjacent photovoltaic roofing element.

Figure 60:
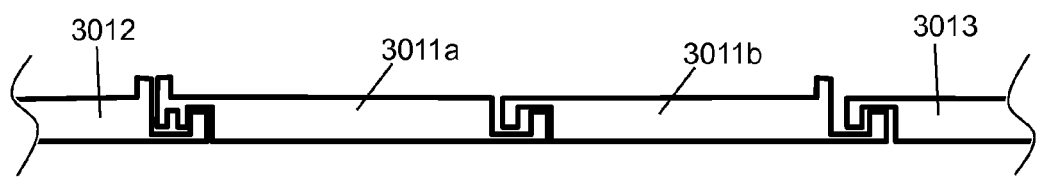
FIG. 60 is a partial cross-sectional view of a photovoltaic roofing system according to one embodiment of the invention.

For example, one embodiment of the invention is shown in partial cross-sectional schematic view in FIG. 60. In this embodiment, the photovoltaic roofing system has two photovoltaic roofing elements 3011*a* and 3011*b* in a lateral course. Each of the photovoltaic roofing elements has an upward-facing channel at its right side, and a downward-facing flange on its left side, with the downward-facing flange of photovoltaic roofing element 3011*b* disposed in the upward-facing channel of photovoltaic roofing element 3011*a*. Disposed at the lateral edge of photovoltaic roofing element 3011*a* is a roofing tile 3012, which includes an upward-facing channel in which the downward-facing flange of phototovoltaic roofing element 3011a is disposed. Similarly, disposed at the lateral edge of photovoltaic roofing element 3011b is a roofing tile 3013, which includes a downward-facing flange which is disposed in the upward-facing channel of photovoltaic roofing element 3011b. As the person of ordinary skill in the art will appreciate, the same type of interlocking can be used to interface adjacent roofing tiles with one another. Alternatively, the roofing tiles can otherwise be designed as is conventional in the art.

Another aspect of the invention is a kit for the installation of a photovoltaic roofing system, the kit comprising a plurality of photovoltaic roofing elements as described herein, a plurality of side flashing elements as described herein, adapted to interlock with the photovoltaic roofing elements of the kit. The kit can further include a plurality of top flashing elements as described herein. The kit can also include a plurality of cant strip elements as described herein.

Another aspect of the invention is a method for installing a photovoltaic array comprising disposing on a surface (e.g., a roof) and electrically interconnecting a plurality of photovoltaic modules as described herein. The disposal on the surface and electrical interconnections can be performed in any desirable order. The method can further include disposing a cover over substantially laterally aligned electrical elements of the photovoltaic array. In other embodiments, the method can comprise placement of wiring within wiring containment structures as described herein.

Further, the foregoing description of embodiments of the present invention has been presented for the purposes of illustration and description. It is not intended to be exhaustive or to limit the invention to the precise forms disclosed. As the person of skill in the art will recognize, many modifications and variations are possible in light of the above teaching. It will be apparent to those skilled in the art that various modifications and variations can be made to the present invention without departing from the scope of the invention. Thus, it is intended that the present invention cover the modifications and variations of this invention provided they come within the scope of the claims and their equivalents.

What is claimed is:

1. A photovoltaic roofing element comprising:
   a frame structure having a top end and a bottom end, and an upward-facing surface and a downward-facing surface, the frame structure having an attachment zone and an exposure zone, with the exposure zone disposed toward the bottom end of the frame structure, and the attachment zone disposed toward the top end of the frame structure, the frame structure further including a ledge extending away from the top end of the frame structure and one or more wind clips extending from the downward-facing surface of the frame structure in the exposure zone, the ledge and the one or more wind clips being configured such that, when installed in a photovoltaic roofing system, the wind clip of an overlying photovoltaic roofing element engages the ledge of an underlying photovoltaic roofing element; and
   one or more photovoltaic elements held in the exposure zone of the frame structure,
   wherein the exposure zone of the frame structure comprises a plurality of horizontal support structures and a plurality of vertical support structures intersecting with the horizontal support structures, the one or more photovoltaic elements being disposed on the horizontal and vertical support structures, the horizontal and vertical support structures defining the downward-facing surface of the frame structure, and the one or more wind clips extend downwardly from one of the horizontal support structures, the one or more wind clips extending downwardly from the downward-facing surface of the remainder of the frame structure; and
   wherein each of the wind clips includes a feature extending substantially horizontally toward the bottom end of the frame structure, the feature being configured such that, when installed in a photovoltaic roofing system, the horizontal feature of an overlying photovoltaic roofing element is disposed under the ledge of an underlying photovoltaic roofing element, the total area of the horizontally-extending features of all wind clips is greater than 20 cm$^2$.

2. The photovoltaic roofing element according to claim 1, wherein the frame structure further includes one or more wiring containment structures, disposed along the top end of the frame structure, downward relative to the ledge.

3. The photovoltaic roofing element according to claim 2, wherein the distance between the ledge and the one or more wiring containment structures is at least 1.5 cm.

4. The photovoltaic roofing element according to claim 1, wherein each of the wind clips includes a feature extending substantially vertically downward from the downward-facing surface of the frame structure, the vertically-extending feature having a downward end, the horizontally-extending feature of the wind clip extending from the downward end of the vertically-extending feature.

5. The photovoltaic roofing element according to claim 1, wherein the vertically-extending feature is configured to act as a positive stop, such that, when installed in a photovoltaic roofing system, the vertical feature of an overlying photovoltaic roofing element is disposed substantially against the ledge of an underlying photovoltaic roofing element.

6. The photovoltaic roofing element according to claim 1, wherein the ledge has one or more breaks formed therein.

7. The photovoltaic roofing element according to claim 2, wherein the ledge has one or more breaks formed therein, the breaks being formed in registration with the one or more wiring containment structures.

8. The photovoltaic roofing element according to claim 6, wherein each break is less wide than the one or more wind clips.

9. A photovoltaic roofing system comprising a first course of horizontally-arranged photovoltaic roofing elements and a second course of horizontally-arranged photovoltaic roofing elements overlying the first course, each photovoltaic roofing element being a photovoltaic roofing element according to claim 1, wherein
   the second course overlies the first course such that the exposure zones of the photovoltaic roofing elements of the first course are substantially exposed and the attachment zones of the photovoltaic roofing elements of the first course are substantially overlaid, and
   the one or more wind clips of each photovoltaic roofing elements of the second course engage the ledge of one or more of the photovoltaic roofing elements of the first course.

10. The photovoltaic roofing system according to claim 9, the photovoltaic roofing elements being contiguously disposed on the roof deck, the contiguously-disposed photovoltaic elements together having a top edge facing the top end of the roof deck, a bottom edge facing the bottom end of the roof deck, and two side edges, the sidelap portions of the photovoltaic roofing elements interlocking to provide water drainage channels;

the photovoltaic roofing system further comprising
- a plurality of roofing elements disposed adjacent the contiguously-disposed photovoltaic roofing elements, along their side edges; and
- side flashing elements disposed along the side edges of the contiguously-disposed photovoltaic roofing elements, the side flashing elements having a cross-sectional shape comprising a vertically-extending feature, the vertically-extending feature having a downward end, and a flange extending away from a lateral side at the downward end of the vertically-extending feature, with the flange facing away from the contiguously-disposed photovoltaic roofing elements and being at least partially disposed between a roofing element and the roof deck, the vertically-extending feature including a matched interlocking geometry adapted to interlock with the sidelap portion of an adjacent photovoltaic roofing element.

11. The photovoltaic roofing system according to claim 10, wherein the vertically-extending features of the side flashing elements along a first lateral edge of the contiguously-disposed photovoltaic roofing elements include a downward-facing flange, disposed in upward-facing channels of the photovoltaic roofing elements disposed along the first lateral edge; and wherein the vertically-extending features of the side flashing elements along a second lateral edge of the contiguously-disposed photovoltaic roofing elements include an upward-facing water drainage channel, into which downward-facing flanges of the photovoltaic roofing elements disposed along the second lateral edge are disposed.

12. The photovoltaic roofing system according to claim 10, further comprising one or more top flashing elements disposed along the top edge of the contiguously-disposed photovoltaic roofing elements, the one or more top flashing elements having a bottom end disposed over the top edge of the contiguously-disposed photovoltaic roofing elements; and a top end disposed under one or more roofing elements disposed along the top edge of the contiguously-disposed photovoltaic roofing elements.

13. The photovoltaic roofing system according to claim 10, wherein one or more side flashing elements is configured such that a conduit is formed underneath the side flashing element and adjacent the frame structure of the photovoltaic roofing element with which it interlocks.

14. The photovoltaic roofing element according to claim 1, wherein the horizontally-extending feature of each wind clip has a length in the range of about 1.5 cm to about 8 cm.

15. The photovoltaic roofing element according to claim 14, wherein the horizontally-extending feature of each wind clip has a width in the range of about 1.5 cm to about 6 cm.

16. The photovoltaic roofing element according to claim 1, wherein the horizontally-extending feature of each wind clip has a width in the range of about 1.5 cm to about 6 cm.

17. The photovoltaic roofing element according to claim 1, wherein the horizontally-extending feature of each wind clip has a surface area in the range of about 1.5 cm$^2$ to about 10 cm$^2$.

18. The photovoltaic roofing element according to claim 1, wherein the total surface area of the horizontally-extending features of all wind clips is greater than 30 cm$^2$.

19. The photovoltaic roofing element according to claim 1, wherein the horizontally-extending feature of each wind clip and each ledge includes one or more detent features, locking features, or a combination thereof.

20. The photovoltaic roofing element according to claim 1, wherein the horizontally-extending feature of each wind clip has substantially no other part of the frame structure disposed in an upward direction therefrom.

\* \* \* \* \*